(12) United States Patent
Lin et al.

(10) Patent No.: US 12,107,169 B2
(45) Date of Patent: Oct. 1, 2024

(54) CONTACT STRUCTURE FOR STACKED MULTI-GATE DEVICE

(71) Applicant: Taiwan Semiconductor Manufacturing Company, Ltd., Hsinchu (TW)

(72) Inventors: Zhi-Chang Lin, Hsinchu County (TW); Shih-Cheng Chen, New Taipei (TW); Jung-Hung Chang, Hsinchu (TW); Chien Ning Yao, Hsinchu (TW); Kuo-Cheng Chiang, Hsinchu County (TW); Chih-Hao Wang, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/349,354

(22) Filed: Jul. 10, 2023

(65) Prior Publication Data
US 2024/0006536 A1  Jan. 4, 2024

Related U.S. Application Data

(63) Continuation of application No. 17/140,532, filed on Jan. 4, 2021, now Pat. No. 11,699,760.

(51) Int. Cl.
*H01L 29/78* (2006.01)
*H01L 21/822* (2006.01)
(Continued)

(52) U.S. Cl.
CPC ...... *H01L 29/7855* (2013.01); *H01L 21/8221* (2013.01); *H01L 21/823412* (2013.01); *H01L 21/823418* (2013.01); *H01L 21/823425* (2013.01); *H01L 21/823431* (2013.01); *H01L 21/823475* (2013.01);
(Continued)

(58) Field of Classification Search
CPC ......... H01L 21/8221; H01L 21/823412; H01L 21/823418; H01L 21/823425; H01L 21/823475; H01L 21/823481; H01L 27/0688; H01L 27/0922; H01L 29/0673; H01L 29/41733; H01L 29/4175; H01L 29/42392; H01L 29/66439; H01L 29/66545; H01L 29/775; H01L 29/78696
See application file for complete search history.

(56) References Cited

U.S. PATENT DOCUMENTS

| | | | |
|---|---|---|---|
| 9,818,872 B2 | 11/2017 | Ching | |
| 9,887,269 B2 | 2/2018 | Ching | |
| 9,899,398 B1 | 2/2018 | Colinge | |
| 10,032,627 B2 | 7/2018 | Lee | |

(Continued)

*Primary Examiner* — Earl N Taylor
(74) *Attorney, Agent, or Firm* — HAYNES AND BOONE, LLP

(57) ABSTRACT

A semiconductor device according to the present disclosure includes a stack of first channel members, a stack of second channel members disposed directly over the stack of first channel members, a bottom source/drain feature in contact with the stack of the first channel members, a separation layer disposed over the bottom source/drain feature, a top source/drain feature in contact with the stack of second channel members and disposed over the separation layer, and a frontside contact that extends through the top source/drain feature and the separation layer to be electrically coupled to the bottom source/drain feature.

20 Claims, 20 Drawing Sheets

(51) Int. Cl.
*H01L 21/8234* (2006.01)
*H01L 27/06* (2006.01)
*H01L 27/092* (2006.01)
*H01L 29/06* (2006.01)
*H01L 29/417* (2006.01)
*H01L 29/423* (2006.01)
*H01L 29/66* (2006.01)
*H01L 29/775* (2006.01)
*H01L 29/786* (2006.01)

(52) U.S. Cl.
CPC .. *H01L 21/823481* (2013.01); *H01L 27/0688* (2013.01); *H01L 27/0922* (2013.01); *H01L 27/0924* (2013.01); *H01L 29/0673* (2013.01); *H01L 29/41733* (2013.01); *H01L 29/4175* (2013.01); *H01L 29/42392* (2013.01); *H01L 29/66439* (2013.01); *H01L 29/66545* (2013.01); *H01L 29/66795* (2013.01); *H01L 29/775* (2013.01); *H01L 29/7851* (2013.01); *H01L 29/78696* (2013.01); *H01L 2029/7858* (2013.01)

(56) References Cited

U.S. PATENT DOCUMENTS

| | | | | |
|---|---|---|---|---|
| 10,109,721 | B2 | 10/2018 | Lin | |
| 10,157,799 | B2 | 12/2018 | Ching | |
| 10,192,867 | B1* | 1/2019 | Frougier | H01L 21/823828 |
| 10,199,502 | B2 | 2/2019 | Huang | |
| 10,256,158 | B1* | 4/2019 | Frougier | H01L 29/42356 |
| 10,290,546 | B2 | 5/2019 | Chiang | |
| 10,475,902 | B2 | 11/2019 | Lee | |
| 11,069,684 | B1* | 7/2021 | Xie | H01L 21/823871 |
| 11,164,792 | B2* | 11/2021 | Xie | H01L 21/02603 |
| 11,177,258 | B2* | 11/2021 | Xie | H01L 27/0922 |
| 2018/0175036 | A1 | 6/2018 | Ching | |
| 2020/0098756 | A1* | 3/2020 | Lilak | H01L 29/66545 |
| 2020/0411518 | A1* | 12/2020 | Fulford | H01L 27/0688 |
| 2021/0005604 | A1* | 1/2021 | Ge | H01L 21/0337 |
| 2021/0210349 | A1* | 7/2021 | Xie | H01L 21/76224 |
| 2021/0265345 | A1* | 8/2021 | Xie | H01L 21/823864 |
| 2022/0068921 | A1* | 3/2022 | Chanemougame | H01L 29/42392 |
| 2022/0085013 | A1* | 3/2022 | Reznicek | H01L 29/66742 |
| 2022/0216340 | A1* | 7/2022 | Lin | H01L 21/823475 |
| 2024/0006536 | A1* | 1/2024 | Lin | H01L 21/823418 |

\* cited by examiner

CONTACT STRUCTURE FOR STACKED MULTI-GATE DEVICE

PRIORITY DATA

This application is a continuation of U.S. patent application Ser. No. 17/140,532, filed Jan. 4, 2021, the entirety of which is hereby incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as integrated circuit (IC) technologies progress towards smaller technology nodes, multi-gate devices have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. The channel region of an MBC transistor may be formed from nanowires, nanosheets, other nanostructures, and/or other suitable structures. The shapes of the channel region have also given an MBC transistor alternative names such as a nanosheet transistor or a nanowire transistor.

As the semiconductor industry further progresses into sub-10 nanometer (nm) technology process nodes in pursuit of higher device density, higher performance, and lower costs, challenges from both fabrication and design issues have led to stacked device structure configurations, such as complementary field effect transistors (C-FET) where an n-type multi-gate transistor and a p-type multi-gate transistor are stacked vertically, one over the other. Formation of a local interconnect feature in such a C-FET may involve forming an opening through an epitaxial source/drain feature or certain dielectric isolation features adjacent the epitaxial source/drain feature.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
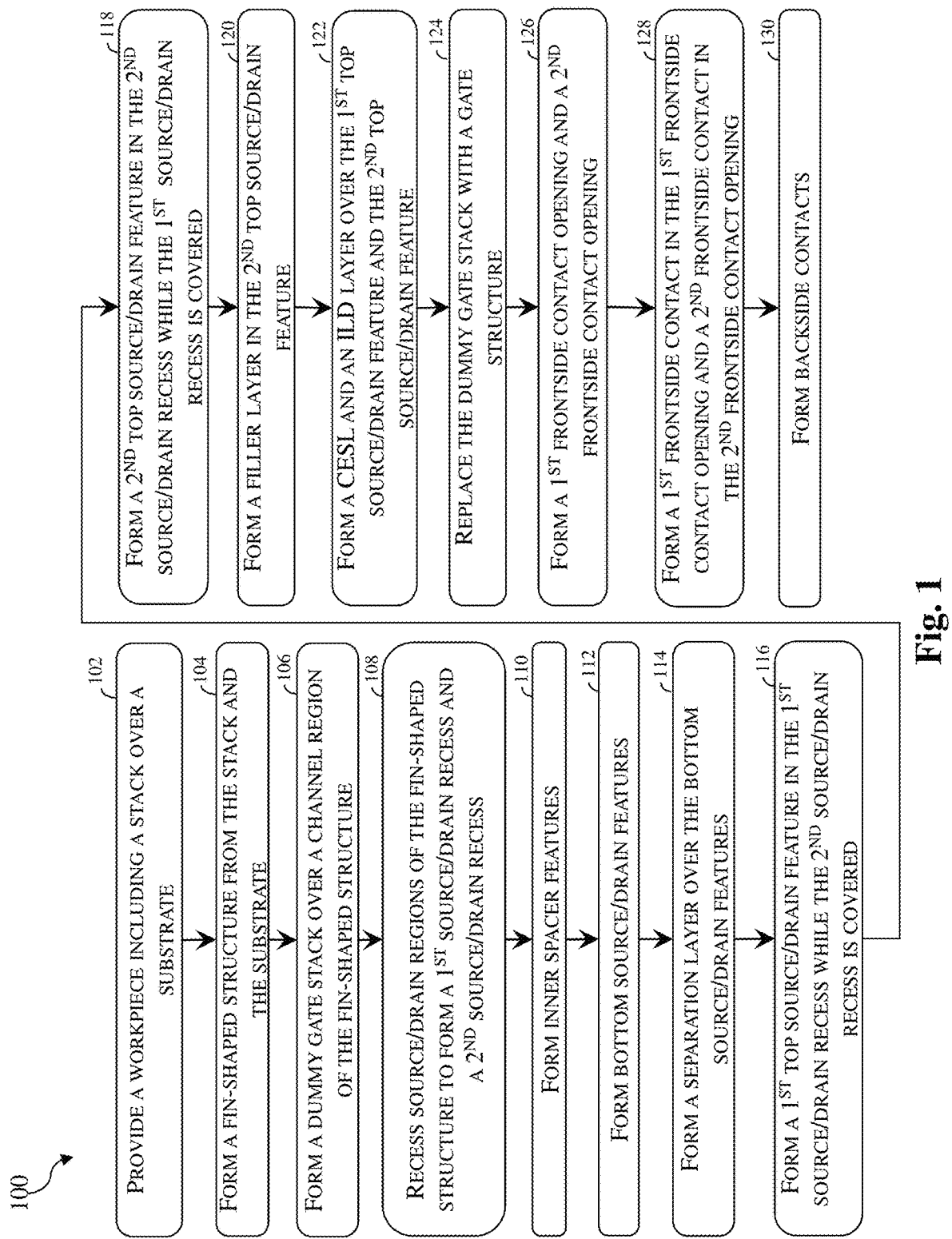
FIG. 1 illustrates a flow chart of a method for forming a semiconductor device having a vertical C-FET structure, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

This application generally relates to stacked multi-gate devices and fabrication processes thereof, and more particularly to local contact structures of stacked multi-gate devices.

A stacked multi-gate device refers to a semiconductor device that includes a first multi-gate device and a second multi-gate device stacked over the first multi-gate device. When the first multi-gate device and the second multi-gate device are of different conductivity types, the stacked multi-gate device may be a complementary field effect transistor (C-FET). The multi-gate devices in a C-FET may be FinFETs or MBC transistors. For some logic operations, a local electrical connection between a source/drain feature of the first multi-gate device and a source/drain feature of the second multi-gate device is needed. In some existing technology, such a local electrical connection may be formed through dielectric features around the source/drain features. In some other existing technology, a through opening is etched through the source/drain feature of the second multi-gate device, which may result in damages to the source/drain feature in the process.

The present disclosure provides a local contact feature that directly and vertically couples a source/drain feature of a top multi-gate device to a source/drain feature of a bottom multi-gate device. The local contact feature is disposed in a local contact opening that is formed in a self-aligned manner. In an example process, a fin-shaped structure is formed from a stack that includes a plurality of channel layers. A bottom source/drain feature is deposited to be in contact with the channel layers in a bottom portion of the stack. A separation layer is deposited over the bottom source/drain feature to disable channel layers in a middle portion of the stack. Then, a top source/drain feature is deposited over the separation layer to be in contact with the channel layers in a top portion of the stack. The top source/drain feature includes a gap that exposes the separation layer. A filler layer is deposited in the gap. A local contact opening is formed through the filler layer and the separation layer to expose the bottom source/drain feature. A local contact feature is formed in the contact opening to couple the bottom source/drain feature and the top source/drain feature. For illustration purposes, the details of the structure and fabrication methods of the present disclosure are described below with respect to C-FETs having stacked MBC transistors. However, the present disclosure is not so limited and similar structures and processes may be applicable to C-FET having other types of stacked multi-gate transistors.

The various aspects of the present disclosure will now be described in more detail with reference to the figures. In that regard, FIG. 1 is a flowchart illustrating method 100 for forming a semiconductor device having a vertical C-FET structure according to various aspects of the present disclosure. Method 100 is merely an example and is not intended to limit the present disclosure to what is explicitly illustrated in method 100. Additional steps may be provided before, during and after method 100, and some steps described can be replaced, eliminated, or moved around for additional embodiments of the method. Not all steps are described herein in detail for reasons of simplicity. Method 100 is described below in conjunction with FIGS. 2-20, which are fragmentary cross-sectional views of a workpiece 200 at different stages of fabrication according to embodiments of method 100. Because the workpiece 200 will be fabricated into a semiconductor device 200 upon conclusion of the fabrication processes, the workpiece 200 may be referred to as the semiconductor device 200 as the context requires. Additionally, throughout the present application, like reference numerals denote like features, unless otherwise excepted.

Figure 2:
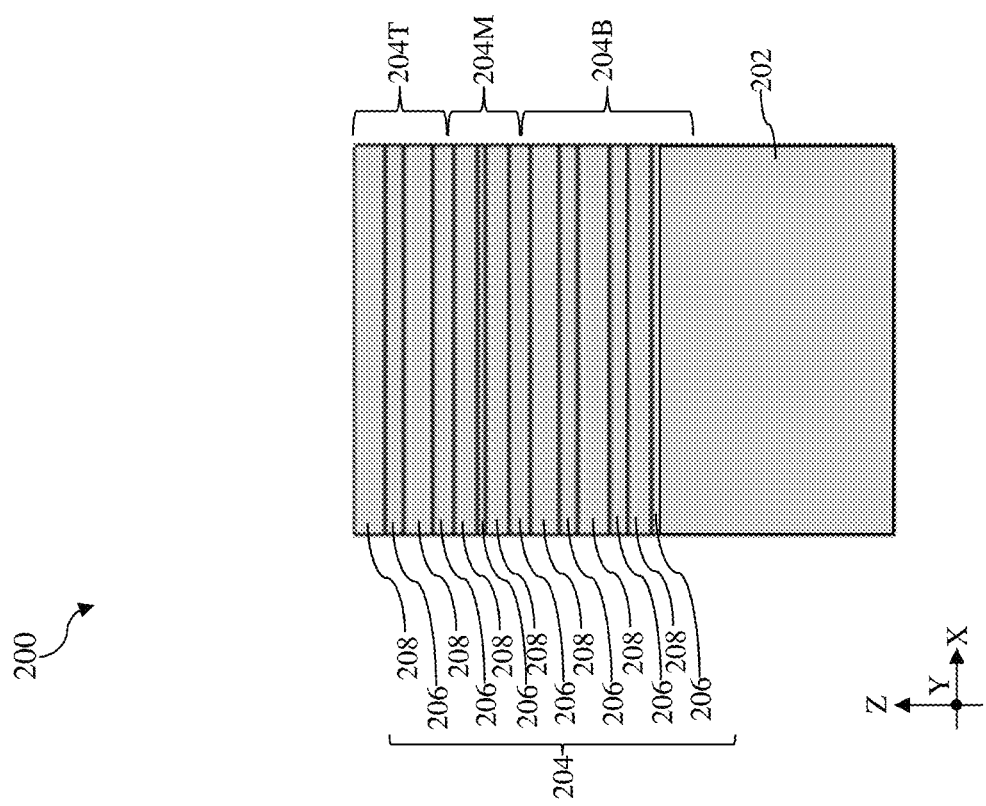
FIGS. 2-20 illustrate fragmentary cross-sectional views of a workpiece undergoing various fabrication processes in the method of FIG. 1, according to one or more aspects of the present disclosure.

Referring to FIGS. 1 and 2, method 100 includes a block 102 where a workpiece 200 is provided. The workpiece 200 may include a substrate 202 and a stack 204 disposed over the substrate 202. In one embodiment, the substrate 202 may be a silicon (Si) substrate. In some other embodiments, the substrate 202 may include other semiconductors such as germanium (Ge), silicon germanium (SiGe), or a III-V semiconductor material. Example III-V semiconductor materials may include gallium arsenide (GaAs), indium phosphide (InP), gallium phosphide (GaP), gallium nitride (GaN), gallium arsenide phosphide (GaAsP), aluminum indium arsenide (AlInAs), aluminum gallium arsenide (AlGaAs), gallium indium phosphide (GaInP), and indium gallium arsenide (InGaAs). The substrate 202 may also include an insulating layer, such as a silicon oxide layer, to have a silicon-on-insulator (SOI) structure. Although not explicitly shown in the figures, the substrate 202 may include an n-type well region and a p-type well region for fabrication of transistors of different conductivity types. When present, each of the n-type well and the p-type well is formed in the substrate 202 and includes a doping profile. An n-type well may include a doping profile of an n-type dopant, such as phosphorus (P) or arsenic (As). A p-type well may include a doping profile of a p-type dopant, such as boron (B). The doping in the n-type well and the p-type well may be formed using ion implantation or thermal diffusion and may be considered portions of the substrate 202.

As shown in FIG. 2, the stack 204 includes a plurality of channel layers 208 interleaved by a plurality of sacrificial layers 206. The channel layers 208 and the sacrificial layers 206 may have different semiconductor compositions. In some implementations, the channel layers 208 are formed of silicon (Si) and sacrificial layers 206 are formed of silicon germanium (SiGe). In these implementations, the additional germanium content in the sacrificial layers 206 allow selective removal or recess of the sacrificial layers 206 without substantial damages to the channel layers 208. In some embodiments, the sacrificial layers 206 and channel layers 208 are epitaxy layers and may be deposited using an epitaxy process. Suitable epitaxy processes include vapor-phase epitaxy (VPE), ultra-high vacuum chemical vapor deposition (UHV-CVD), molecular beam epitaxy (MBE), and/or other suitable processes. The sacrificial layers 206 and the channel layers 208 are deposited alternatingly, one-after-another, to form the stack 204.

As will be explained in greater detail below, the channel layers 208 in the bottom portion of the stack 204 will provide channel members of a bottom MBC transistor, and the channel layers 208 in the top portion of the stack 204 will provide channel members of a top MBC transistor. The term "channel member(s)" is used herein to designate any material portion for channel(s) in a transistor with nanoscale dimensions, and having an elongate shape, regardless of the cross-sectional shape of this portion. Channel members may come in forms of nanowires, nanosheet, or other nanostructures and may have cross-sections that are circular, oval, race-track shaped, rectangular, or square. For ease of references, the stack 204 may be vertically divided into a bottom portion 204B, a middle portion 204M over the bottom portion 204B, and a top portion 204T over the middle portion 204M. As shown in FIG. 2, each of the bottom portion 204B, the middle portion 204M, and the top portion 204T include one or more channel layers 208 and one or more sacrificial layers 206.

It is noted that the stack 204 in FIG. 2 includes eight (8) layers of the channel layers 208 interleaved by seven (7) layers of sacrificial layers 206, which is for illustrative purposes only and not intended to be limiting beyond what is specifically recited in the claims. It can be appreciated that any number of the channel layers 208 can be included in the stack 204 and distributed among the bottom portion 204B, the middle portion 204M, and the top portion 204T. The number of layers depends on the desired number of channels members for the top MBC transistor and the bottom MBC transistor. In some embodiments, the number of the channel layers 208 in the stack 204 may be between 3 and 12. The thicknesses of the channel layers 208 and the sacrificial layers 206 may be selected based on device performance considerations of the bottom MBC transistor, the top MBC transistor, and the C-FET as a whole. Additionally, channel layers 208 and the sacrificial layers 206 may be intentionally made thinner to form one or more disabled channel members. For example, a channel layer 208 that is thinner than the rest of the channel layers 208 may be severed or compromised during the channel release process. For another example, a sacrificial layer 206 that is thinner than the rest of the sacrificial layers 206 may result in a reduced channel-channel spacing that may be substantially filled up by gate dielectric material. The gate dielectric material in the reduced channel-channel spacing will prevent gate electrode material from being inserted into the reduced channel-channel spacing.

Figure 3:
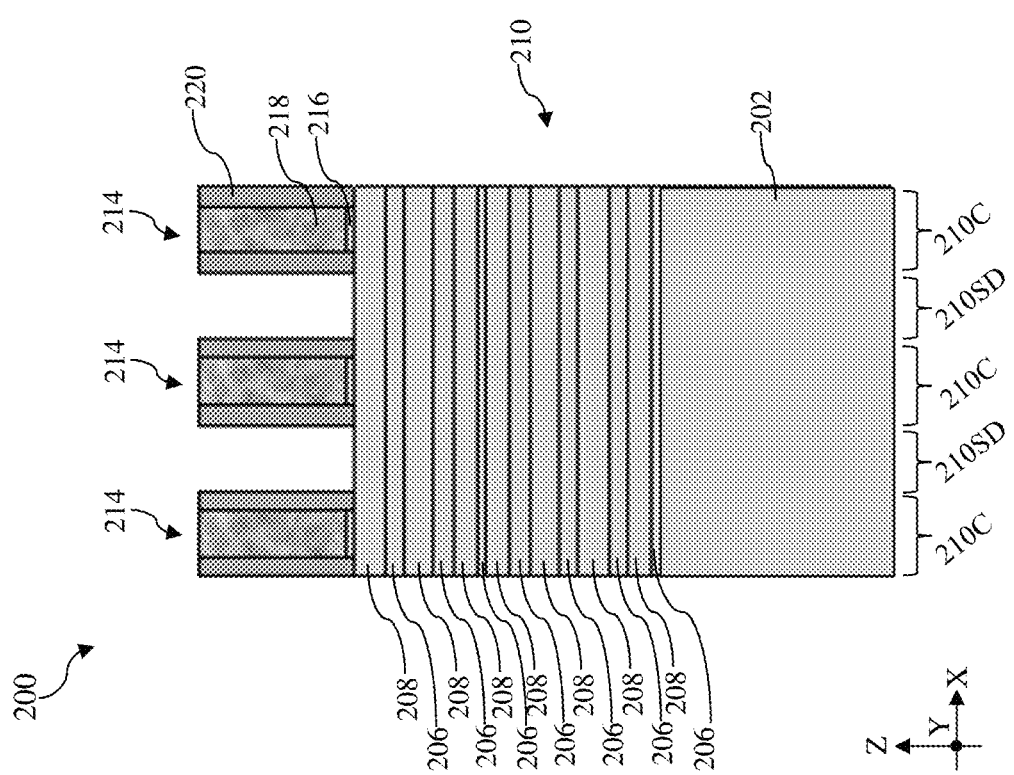

Referring to FIGS. 1 and 3, method 100 includes a block 104 where a fin-shaped structure 210 is formed from the stack 204. In some embodiments, the stack 204 and a portion of the substrate 202 are patterned to form the fin-shaped structure 210. For patterning purposes, a hard mask layer may be deposited over the stack 204. The hard mask layer may be a single layer or a multilayer. In one example, the hard mask layer includes a silicon oxide layer and a silicon nitride layer over the silicon oxide layer. As shown in FIG. 3, the fin-shaped structure 210 extends vertically along the Z direction from the substrate 202 and extends lengthwise along the X direction. The fin-shaped structure 210 may be patterned using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a material layer is formed over a substrate and patterned using a photolithography process. Spacers are formed alongside the patterned material layer using a self-aligned process. The material layer is then removed, and the remaining spacers, or mandrels, may then be used as an etch mask to etch the stack 204 and the substrate 202 to form the fin-shaped structure 210. The etching process may include dry etching, wet etching, reactive ion etching (RIE), and/or other suitable processes.

While not explicitly shown in FIG. 3, after the fin-shaped structure 210 is formed, an isolation feature is formed to separate the fin-shaped structure 210 from an adjacent fin-shaped structure (not explicitly shown). The isolation feature may also be referred to as a shallow trench isolation (STI) feature. In an example process, a dielectric material for the isolation feature is deposited over the workpiece 200, including the fin-shaped structure 210, using CVD, subatmospheric CVD (SACVD), flowable CVD, spin-on coating, and/or other suitable process. Then the deposited dielectric material is planarized and recessed until the fin-shaped structure 210 rises above the isolation feature. The dielectric material for the isolation feature may include silicon oxide, silicon oxynitride, fluorine-doped silicate glass (FSG), a low-k dielectric, combinations thereof, and/or other suitable materials.

Referring still to FIGS. 1 and 3, method 100 includes a block 106 where a dummy gate stack 214 is formed over the stack 204. In some embodiments, a gate replacement process (or gate-last process) is adopted where the dummy gate stack 214 serves as a placeholder for a functional gate structure. Other processes and configuration are possible. To form the dummy gate stack 214, a dummy dielectric layer 216, a dummy gate electrode layer 218, and a gate-top hard mask layer (not explicitly shown) are deposited over the workpiece 200. The deposition of these layers may include use of low-pressure CVD (LPCVD), CVD, plasma-enhanced CVD (PECVD), PVD, ALD, thermal oxidation, e-beam evaporation, or other suitable deposition techniques, or combinations thereof. The dummy dielectric layer 216 may include silicon oxide, the dummy gate electrode layer 218 may include polysilicon, and the gate-top hard mask layer may be a multi-layer that includes silicon oxide and silicon nitride. Using photolithography and etching processes, the gate-top hard mask layer is patterned. The photolithography process may include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. The etching process may include dry etching (e.g., RIE etching), wet etching, and/or other etching methods. Thereafter, using the patterned gate-top hard mask as the etch mask, the dummy dielectric layer 216 and the dummy gate electrode layer 218 are then etched to form the dummy gate stack 214. The dummy gate stack 214 extends lengthwise along the Y direction to wrap over the fin-shaped structure 210 and lands on the isolation feature. The portion of the fin-shaped structure 210 underlying the dummy gate stack 214 defines a channel region 210C. The channel region 210C and the dummy gate stack 214 also define source/drain regions 210SD that are not vertically overlapped by the dummy gate stack 214. The channel region 210C is disposed between two source/drain regions 210SD along the X direction.

Figure 4:
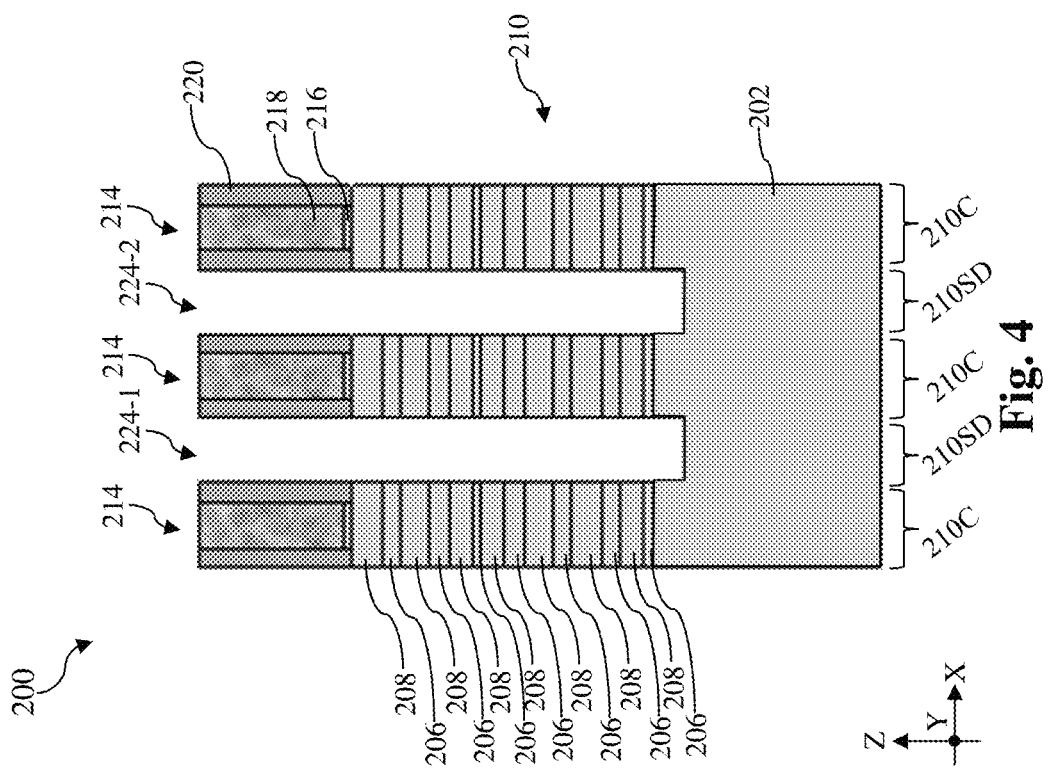

Referring to FIGS. 1 and 4, method 100 includes a block 108 where source/drain regions 210SD of the fin-shaped structure 210 are recessed to a first source/drain recess 224-1 and a second source/drain recess 224-2. Operations at block 108 may include formation of a gate spacer layer 220 over the sidewalls of the dummy gate stack 214 before the source/drain regions 210SD are recessed. In some embodiments, the formation of the gate spacer layer 220 includes deposition of one or more dielectric layers over the workpiece 200. In an example process, the one or more dielectric layers are deposited using CVD, SACVD, or ALD. The one or more dielectric layers may include silicon oxide, silicon nitride, silicon carbide, silicon oxynitride, silicon carbonitride, silicon oxycarbide, silicon oxycarbonitride, and/or combinations thereof. After the deposition of the gate spacer layer 220, the workpiece 200 is etched in an anisotropic etch process to form the first source/drain recess 224-1 and the second source/drain recess 224-2. The etch process at block 108 may be a dry etch process or a suitable etch process. An example dry etch process may implement an oxygen-containing gas, hydrogen, a fluorine-containing gas (e.g., $CF_4$, $SF_6$, $NF_3$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. As shown in FIG. 4, sidewalls of the sacrificial layers 206 and the channel layers 208 in the channel regions 210C are exposed in the first source/drain recess 224-1 and the second source/drain recess 224-2.

Figure 5:
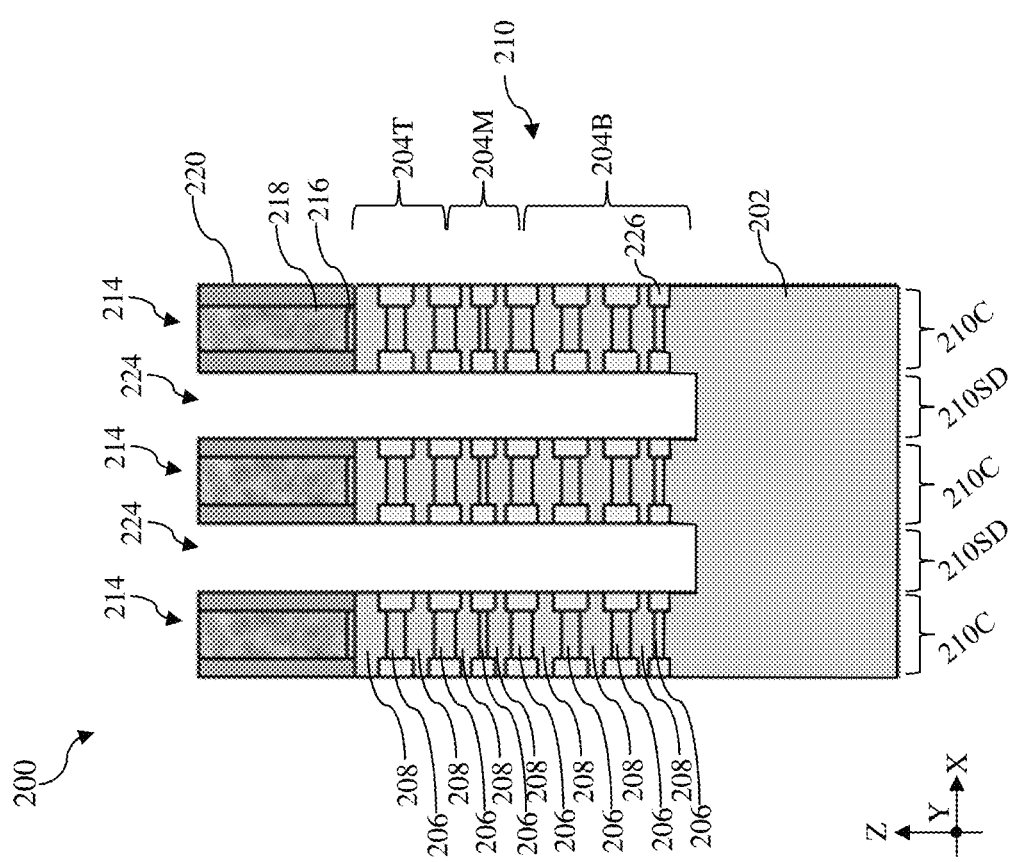

Referring to FIGS. 1 and 5, method 100 includes a block 110 where inner spacer features 226 are formed. At block 110, the sacrificial layers 206 in the bottom portion 204B, the middle portion 204M, and the top portion 204T exposed in the first source/drain recess 224-1 and the second source/drain recess 224-2 are selectively and partially recessed to form inner spacer recesses, while the exposed channel layers 208 are substantially unetched. In an embodiment where the channel layers 208 consist essentially of silicon (Si) and sacrificial layers 206 consist essentially of silicon germanium (SiGe), the selective and partial recess of the sacrificial layers 206 may include a SiGe oxidation process followed by a SiGe oxide removal. In that embodiments, the SiGe oxidation process may include use of ozone ($O_3$). In some other embodiments, the selective recess may be a selective isotropic etching process (e.g., a selective dry etching process or a selective wet etching process), and the extent at which the sacrificial layers 206 are recessed is controlled by duration of the etching process. The selective dry etching process may include use of one or more fluorine-based etchants, such as fluorine gas or hydrofluorocarbons. The selective wet etching process may include use of hydrogen fluoride (HF) or ammonium hydroxide ($NH_4OH$). After the formation of the inner spacer recesses, an inner spacer material layer is deposited over the workpiece 200, including in the inner spacer recesses. The inner spacer material layer may include silicon oxide, silicon nitride, silicon oxycarbide, silicon oxycarbonitride, silicon carbonitride, metal nitride, or a suitable dielectric material. The deposited inner spacer material layer is then etched back to remove excess inner spacer material layer over the gate spacer layer and sidewalls of the channel layers 208, thereby forming the inner spacer features 226 as shown in FIG. 5. In some embodiments, the etch back process at block 110 may be a dry etch process that includes use of an oxygen-containing gas, hydrogen, nitrogen, a fluorine-containing gas (e.g., $NF_3$, $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas (e.g., $CF_3I$), other suitable gases and/or plasmas, and/or combinations thereof.

Figure 6:
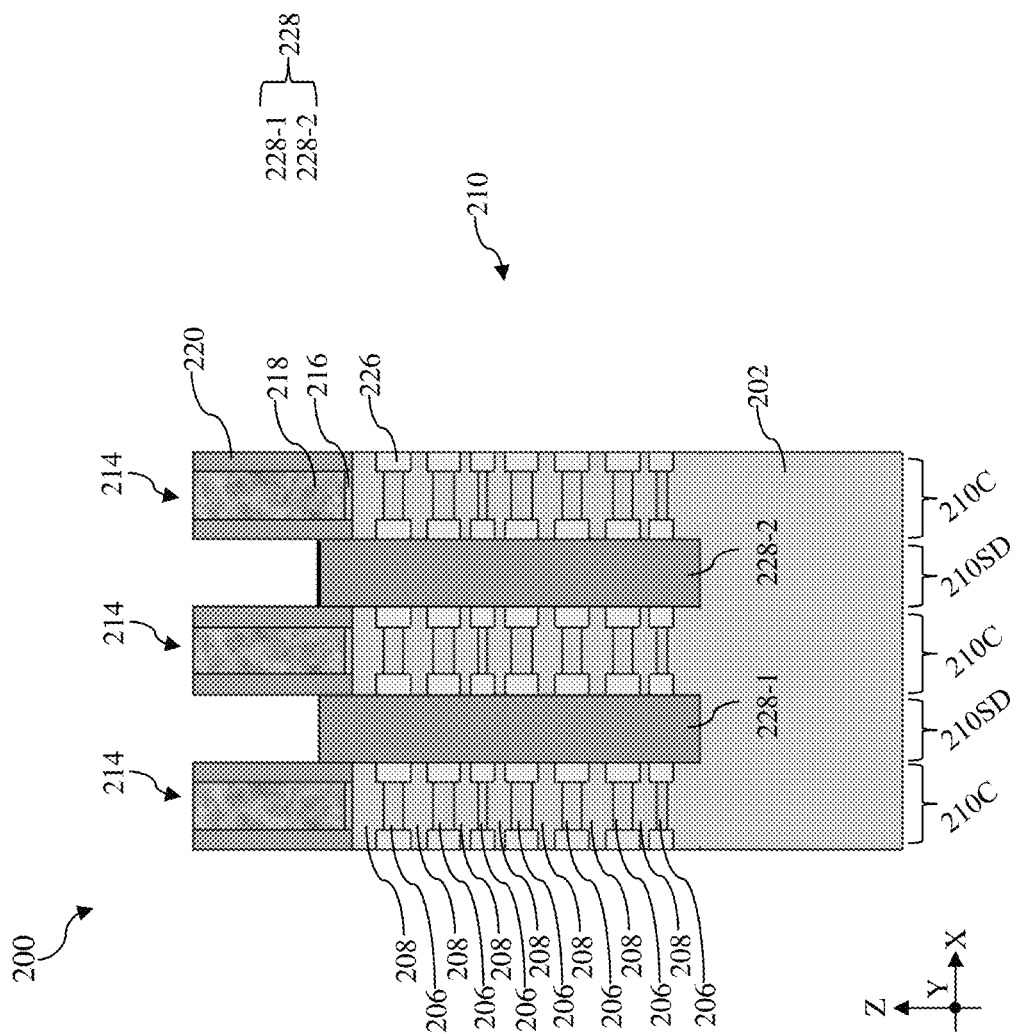
Figure 7:
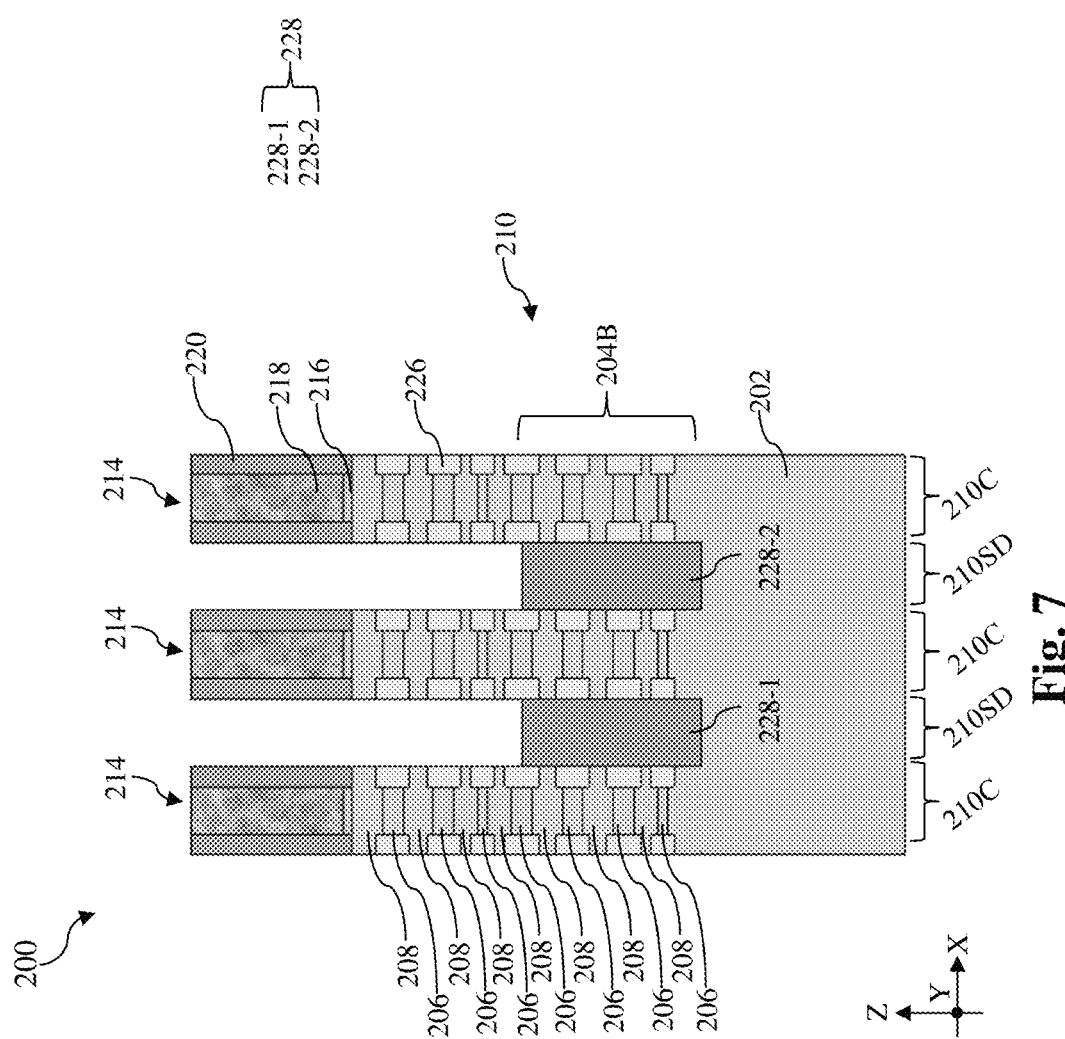

Referring to FIGS. 1, 6, and 7, method 100 includes a block 112 where a first bottom source/drain feature 228-1 and a second bottom source/drain feature 228-2 are formed in the first source/drain recess 224-1 and the second source/drain recess 224-2, respectively. For ease of reference, the first bottom source/drain feature 228-1 and the second bottom source/drain feature 228-2 may be collectively referred to as bottom source/drain features 228. Reference is first made to FIG. 6. In some embodiments, the bottom source/drain features 228 may be formed using an epitaxial process, such as VPE, UHV-CVD, MBE, and/or other suitable processes. The epitaxial growth process may use gaseous and/or liquid precursors, which interact with the composition of the substrate 202 as well as the channel layers 208. The epitaxial growth of bottom source/drain features 228 may take place from both the top surface of the substrate 202 and the exposed sidewalls of the channel layers 208. As illustrated in FIG. 6, the deposited bottom source/drain features 228 are in physical contact with (or adjoining) the channel layers 208. Although the epitaxial growth of bottom source/drain features 228 is less likely to take place on surfaces of the inner spacer features 226, overgrowth of the bottom source/drain features 228 allow the bottom source/drain features 228 to merge over the inner spacer features 226. Depending on the design, the bottom source/drain features 228 may be n-type or p-type. In the depicted embodiments, the bottom source/drain features 228 are p-type source/drain features and may include silicon germanium (SiGe) doped with a p-type dopant, such as boron (B). In these depicted embodiments, the bottom source/drain features 228 may include boron doped silicon germanium (SiGe:B). Having the bottom source/drain features 228 as p-type source/drain features has some advantages. For example, its silicon germanium (SiGe) composition may facilitate selective removal of the substrate 202 during formation of backside contacts and backside dielectric layers. For another example, the exposed substrate 202 provides more epitaxial seed surfaces to form a less defective silicon germanium source/drain crystal structure to provide needed strain on the channel members. It is observed that strained silicon channels provide better hole mobility than unstrained silicon channels.

Referring to FIG. 7, the deposited bottom source/drain features 228 are then etched back/pulled back until the bottom source/drain features 228 only cover channel layers 208 in the bottom portion 204B but not the channel layers 208 in the middle portion 204M or the top portion 204T. The etch back or pull back process may include dry etching, wet etching, and/or other suitable processes. Because the bottom source/drain features 228 and the sacrificial layers 206 are all formed of silicon germanium (SiGe), the etch process used to form the inner spacer recesses may be used to etch back the deposited bottom source/drain features 228. An example selective dry etching process at block 112 may include use of one or more fluorine-based etchants, such as fluorine gas or hydrofluorocarbons. An example selective wet etching process at block 112 may include use of hydrogen fluoride (HF) or ammonium hydroxide ($NH_4OH$).

Figure 8:
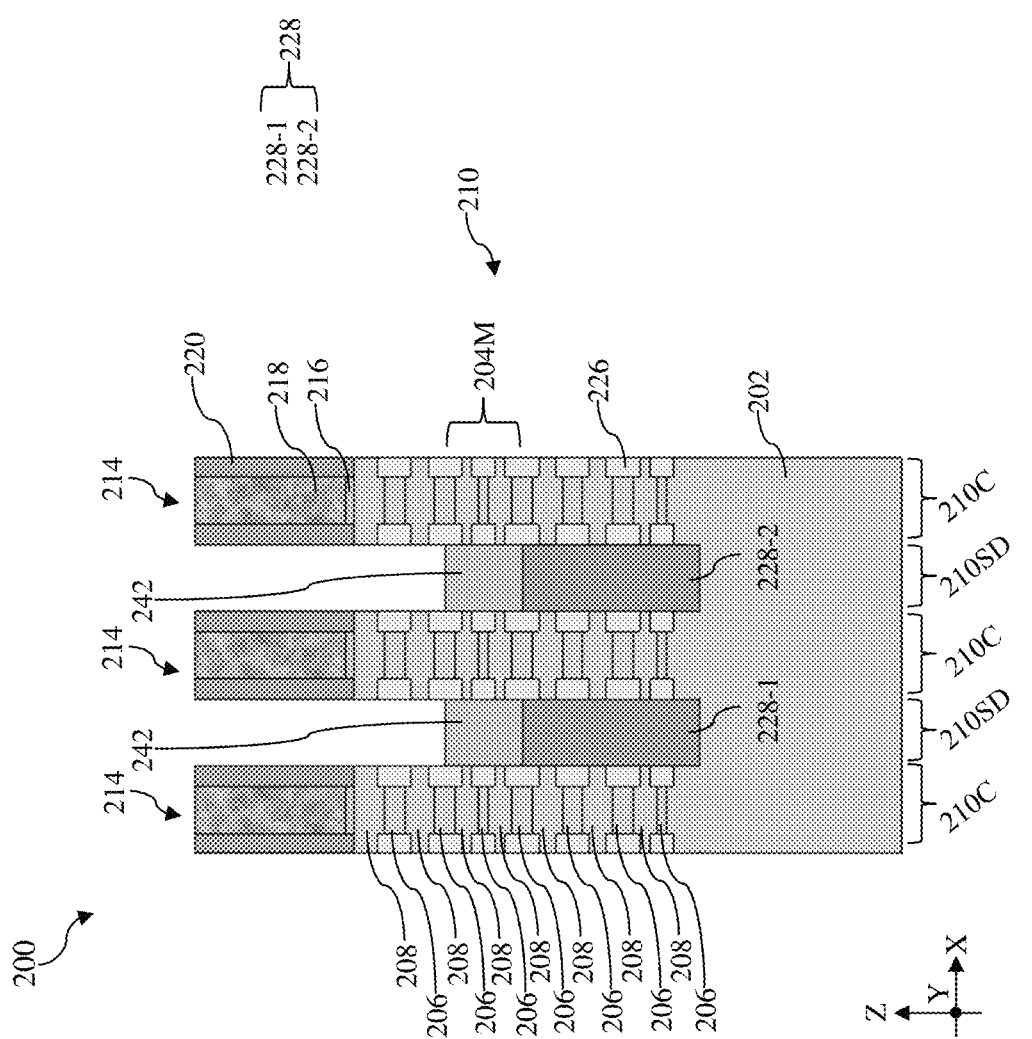

Referring to FIGS. 1 and 8, method 100 includes a block 114 where a separation layer 242 is formed over the bottom source/drain features 228. The separation layer 242 may also be referred to as an isolation layer 242 as it functions to separate or isolate the bottom source/drain features 228 from top source/drain features (to be described below). In some embodiments, the separation layer 242 may include silicon oxide or a silicon oxide containing material, such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. In one embodiment, the separation layer 242 includes silicon oxide. In some implementations, the separation layer 242 may be formed by depositing a dielectric material over the workpiece 200, including over the first bottom source/drain feature 228-1 and the second bottom source/drain feature 228-2, by flowable CVD (FCVD), CVD, high density plasma CVD (HDPCVD), or a suitable deposition technique. In one embodiment, the dielectric material for the separation layer 242 may be deposited using FCVD. The deposited dielectric material is then etched back until the separation layer 242 only covers channel layers 208 in the middle portion 204M, but the channel layers 208 in the top portion 204T.

Figure 9:
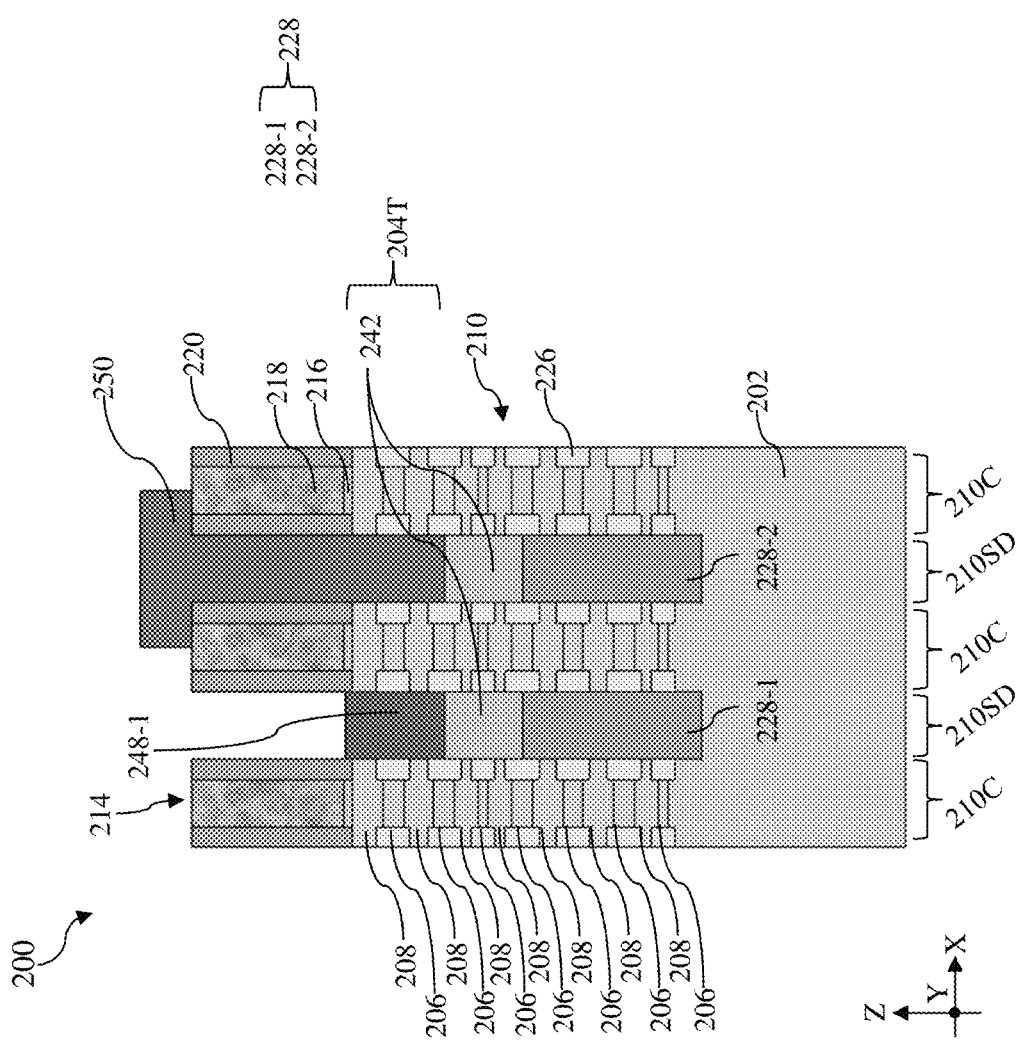

Referring to FIGS. 1 and 9, method 100 includes a block 116 where a first top source/drain feature 248-1 is formed in the first source/drain recess 224-1 while the second source/drain recess 224-2 is covered by a first masking layer 250. At block 116, the first masking layer 250 is deposited over the workpiece 200 and is then patterned to cover the second source/drain recess 224-2 while the first source/drain recess 224-1 is exposed. In one embodiment, the first masking layer 250 is a bottom antireflective coating (BARC) layer that may include polysulfones, polyureas, polyurea sulfones, polyacrylates, poly(vinyl pyridine), or a silicon-containing polymer. In another embodiment, the first masking layer 250 is a hard mask layer that may be a single layer or a multi-layer. For example, when the first masking layer 250 is a hard mask layer, the first masking layer 250 may include silicon oxide, silicon nitride, silicon carbide, silicon oxycarbide, silicon oxynitride, or silicon oxycarbonitride. Photolithography and etching processes may be used to pattern the first masking layer 250 shown in FIG. 9. The photolithography process may include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. The resulting patterned photoresist layer is then applied as an etch mask to pattern the first masking layer 250.

With the first masking layer 250 covering the second source/drain recess 224-2, the first top source/drain feature 248-1 is deposited over the separation layer 242 in the first source/drain recess 224-1. Similar to the first bottom source/drain feature 228-1 and the second bottom source/drain feature 228-2, the first top source/drain feature 248-1 may be formed using an epitaxial process, such as VPE, UHV-CVD, MBE, and/or other suitable processes. The epitaxial growth process may use gaseous and/or liquid precursors, which interact with the channel layers 208 in the top portion 204T. Therefore, the epitaxial growth of the first top source/drain feature 248-1 may take place from the exposed sidewalls of the channel layers 208 in the top portion 204T, but not from surfaces of the inner spacer features 226 in the top portion 204T and the separation layer 242. As shown in FIG. 9, overgrowth of the first top source/drain feature 248-1 may merge over the inner spacer features 226 and the separation layer 242. In embodiments represented in FIG. 9, the deposition of the first top source/drain feature 248-1 is performed for a duration to substantially fill the space between two adjacent top portions 204T of two adjacent channel regions 210C. Depending on the design, the first top source/drain feature 248-1 may be n-type or p-type. In the depicted embodiments, the first top source/drain feature 248-1 is an n-type source/drain feature and may include silicon (Si) doped with an n-type dopant, such as phosphorus (P) or arsenic (As). In these depicted embodiments, the first top source/drain feature 248-1 may include phosphorus doped silicon (Si:P). After the formation of the first top source/drain feature 248-1, the first masking layer 250 is remover by, for example, ashing, stripping, or selective etching.

Figure 10:
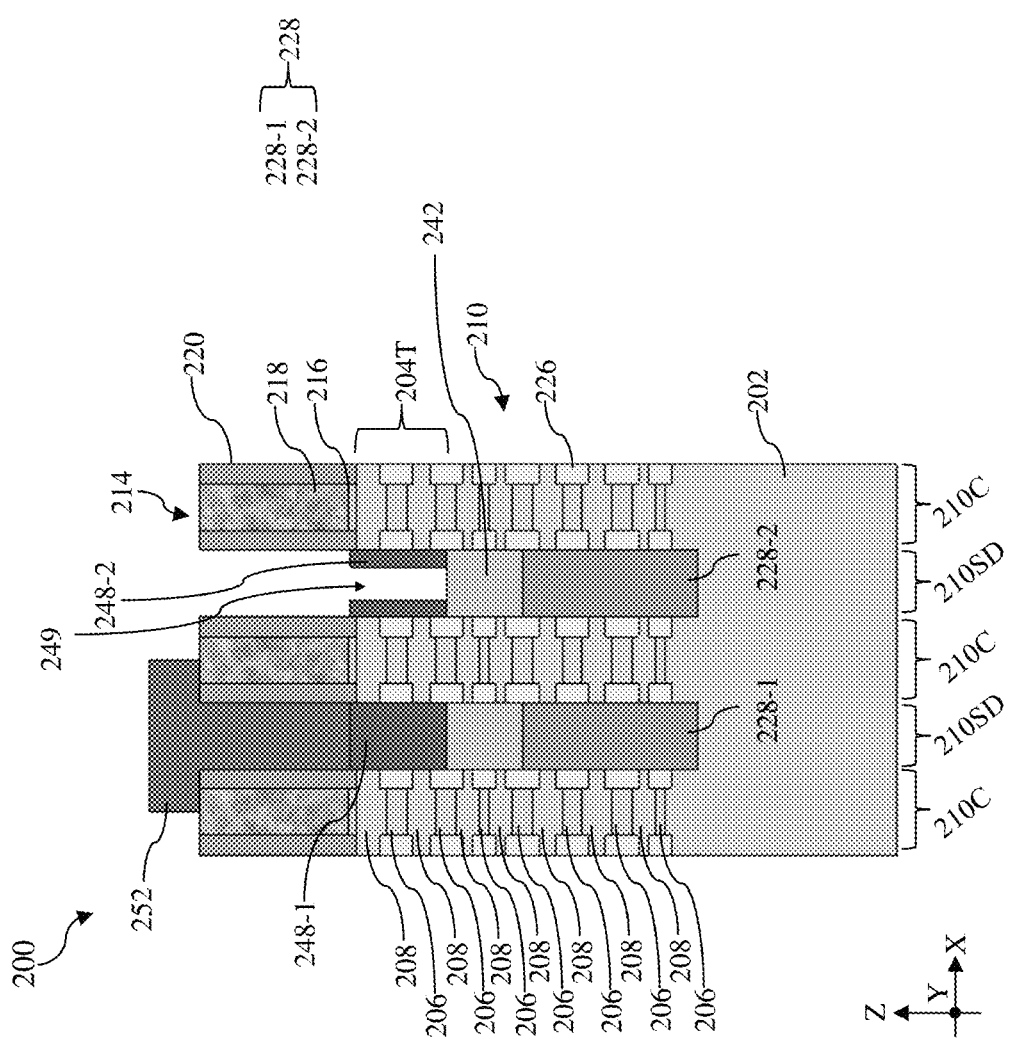

Referring to FIGS. 1 and 10, method 100 includes a block 118 where a second top source/drain feature 248-2 is formed in the second source/drain recess 224-2 while the first source/drain recess 224-1 is covered by a second masking layer 252. At block 118, the second masking layer 252 is deposited over the workpiece 200 and is then patterned to cover the first top source/drain feature 248-1 while the second source/drain recess 224-2 is exposed. In one embodiment, the second masking layer 252 is a bottom antireflective coating (BARC) layer that may include poly sulfones, polyureas, polyurea sulfones, polyacrylates, poly(vinyl pyridine), or a silicon-containing polymer. In another embodiment, the second masking layer 252 is a hard mask layer that may be a single layer or a multi-layer. For example, when the second masking layer 252 is a hard mask layer, the second masking layer 252 may include silicon oxide, silicon nitride, silicon carbide, silicon oxycarbide, silicon oxynitride, or silicon oxycarbonitride. Photolithography and etching processes may be used to pattern the second masking layer 252 shown in FIG. 10. The photolithography process may include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. The resulting patterned photoresist layer is then applied as an etch mask to pattern the second masking layer 252.

With the second masking layer 252 covering the first top source/drain feature 248-1, the second top source/drain feature 248-2 is deposited in the second source/drain recess 224-2. The second top source/drain feature 248-2 may be formed using an epitaxial process, such as VPE, UHV-CVD, MBE, and/or other suitable processes. The epitaxial growth process may use gaseous and/or liquid precursors, which interact with the channel layers 208 in the top portion 204T exposed in the second source/drain recess 224-2. Therefore, the epitaxial growth of the second top source/drain feature 248-2 may take place from the exposed sidewalls of the channel layers 208 in the top portion 204T, but not from surfaces of the inner spacer features 226 in the top portion 204T and the separation layer 242. As shown in FIG. 10, overgrowth of the second top source/drain feature 248-2 may merge over the inner spacer features 226. Unlike the first top source/drain feature 248-1, the deposition of the second top source/drain feature 248-2 lasts for a shorter duration such that the second top source/drain feature 248-2 does merge over the separation layer 242. In some instances, the second top source/drain feature 248-2 may have a thickness, along the X direction, between 2 nm and about 10 nm. That is, the second top source/drain feature 248-2 is allowed to merge over the inner spacer features 226 along the Z direction but is not allowed to grow the thickness to merge over the separation layer 242 along the X direction. As shown in FIG. 10, after the second top source/drain feature 248-2 is fully formed at block 118, a gap 249 remains in the second top source/drain feature 248-2 and the separation layer 242 is exposed in the gap 249. Depending on the design, the second top source/drain feature 248-2 may be n-type or p-type. In the depicted embodiments, the second top source/drain feature 248-2, like the first top source/drain feature 248-1, is an n-type source/drain feature and may include silicon (Si) doped with an n-type dopant, such as phosphorus (P) or arsenic (As). In these depicted embodiments, the second top source/drain feature 248-2 may include phosphorus doped silicon (Si:P). After the formation of the second top source/drain feature 248-2, the second masking layer 252 is remover by, for example, ashing, stripping, or selective etching.

Figure 11:
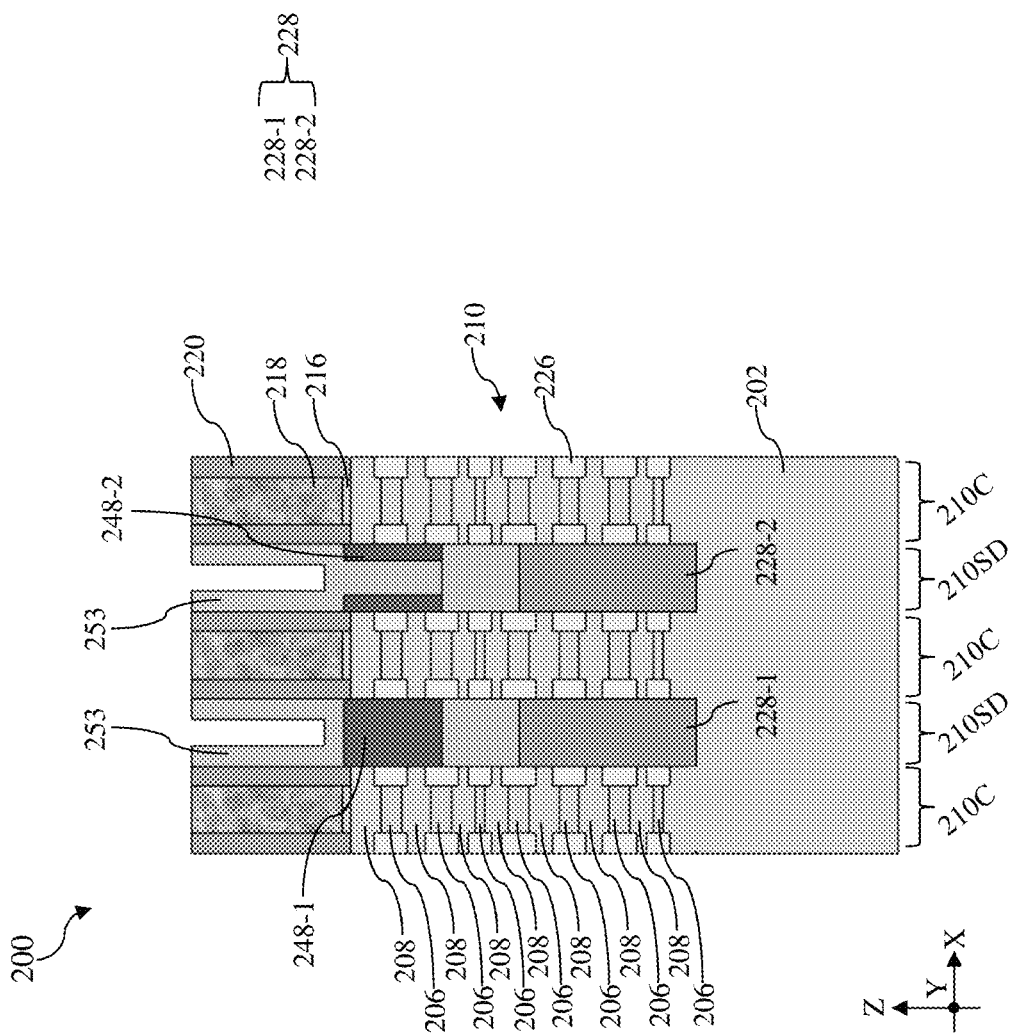
Figure 12:
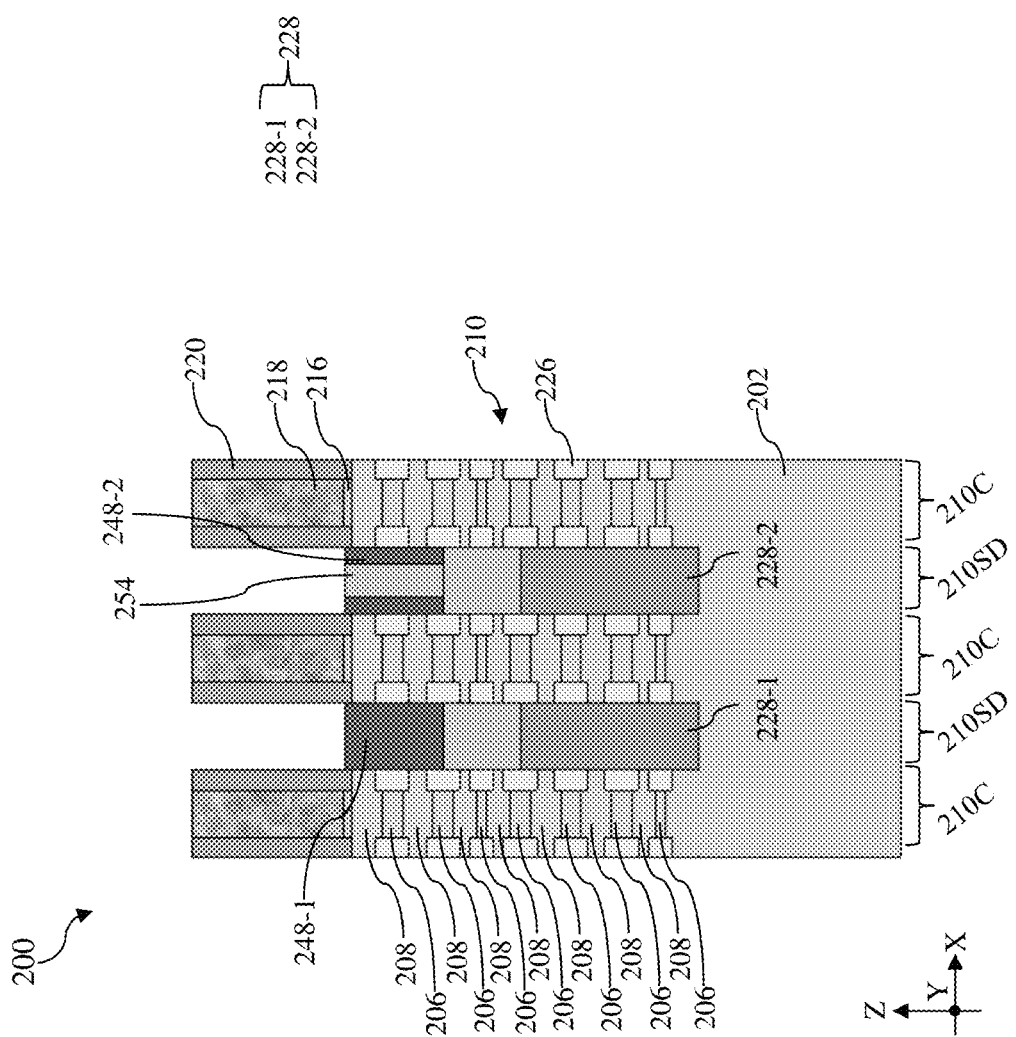

Referring to FIGS. 1, 11 and 12, method 100 includes a block 120 where a filler layer 254 is formed in the gap 249 in the second top source/drain feature 248-2. Operations at block 120 may include depositing a filler material 253 over the workpiece 200 (as shown in FIG. 11) and etching back the filler material 253 to form the filler layer 254 in the gap 249 (as shown in FIG. 12). In some embodiments, the filler material 253 may be deposited using ALD, FCVD or HDPCVD. In one embodiment, the filler material 253 may be deposited using ALD. ALD-deposited filler material 253 may fill the gap 249 efficiently and requires little etching back to form the filler layer 254. As shown in FIG. 11, the deposited filler material 253 not only fills in the gap 249 but also is disposed over the first top source/drain feature 248-1 and sidewalls of the gate spacer layer 220. The filler material 253 may include a dielectric material. In some implementations, a composition of the filler material 253 may be similar to a composition of the separation layer 242. In some instances, the filler material 253 may include silicon oxide or a silicon oxide containing material, such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. In one embodiment, the filler material 253 may include silicon oxide. In some embodiments, the filler material 253 is etched back until the first top source/drain feature 248-1 and the second top source/drain feature 248-2 are exposed in the first source/drain recess 224-1 and the second source/drain recess 224-2. At the conclusion of the operations of block 120, the filler layer 254 is formed, as shown in FIG. 12. The filler layer 254 serves as a plug to plug the gap 249 shown in FIG. 10.

Figure 13:
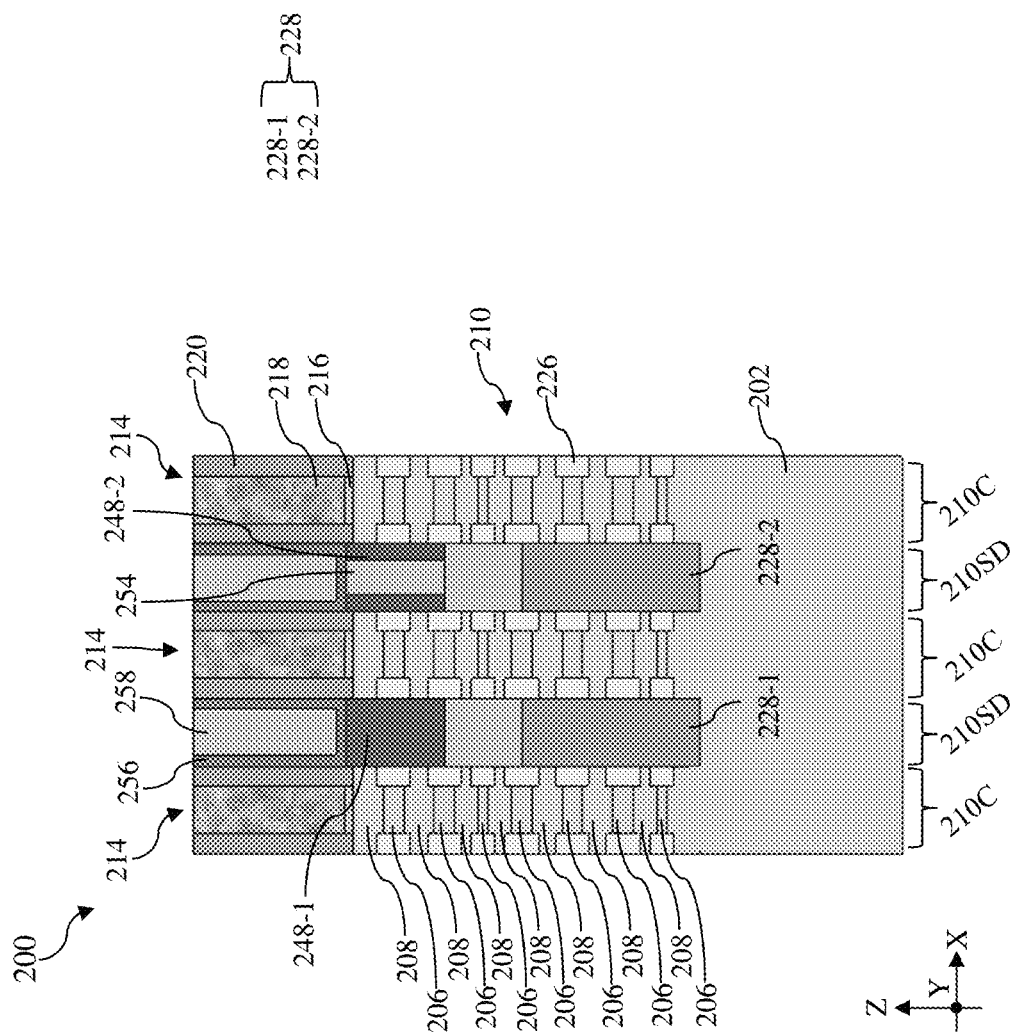

Referring to FIGS. 1 and 13, method 100 includes a block 122 where a contact etch stop layer (CESL) 256 and an interlayer dielectric (ILD) layer 258 are deposited on the first top source/drain feature 248-1 and the second top source/drain feature 248-2. The CESL 256 may include silicon nitride, silicon oxynitride, and/or other materials known in the art and may be formed by CVD, ALD, plasma-enhanced chemical vapor deposition (PECVD) process and/or other suitable deposition or oxidation processes. In some embodiments, the CESL 256 is first conformally deposited on the workpiece 200 and the ILD layer 258 is deposited over the CESL 256 by spin-on coating, FCVD, CVD, or other suitable deposition technique. The ILD layer 258 may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. In some embodiments, after formation of the ILD layer 258, the workpiece 200 may be annealed to improve integrity of the ILD layer 258. To remove excess materials and to expose top surfaces of the dummy gate stacks 214, a planarization process, such a chemical mechanical polishing (CMP) process may be performed.

Figure 14:
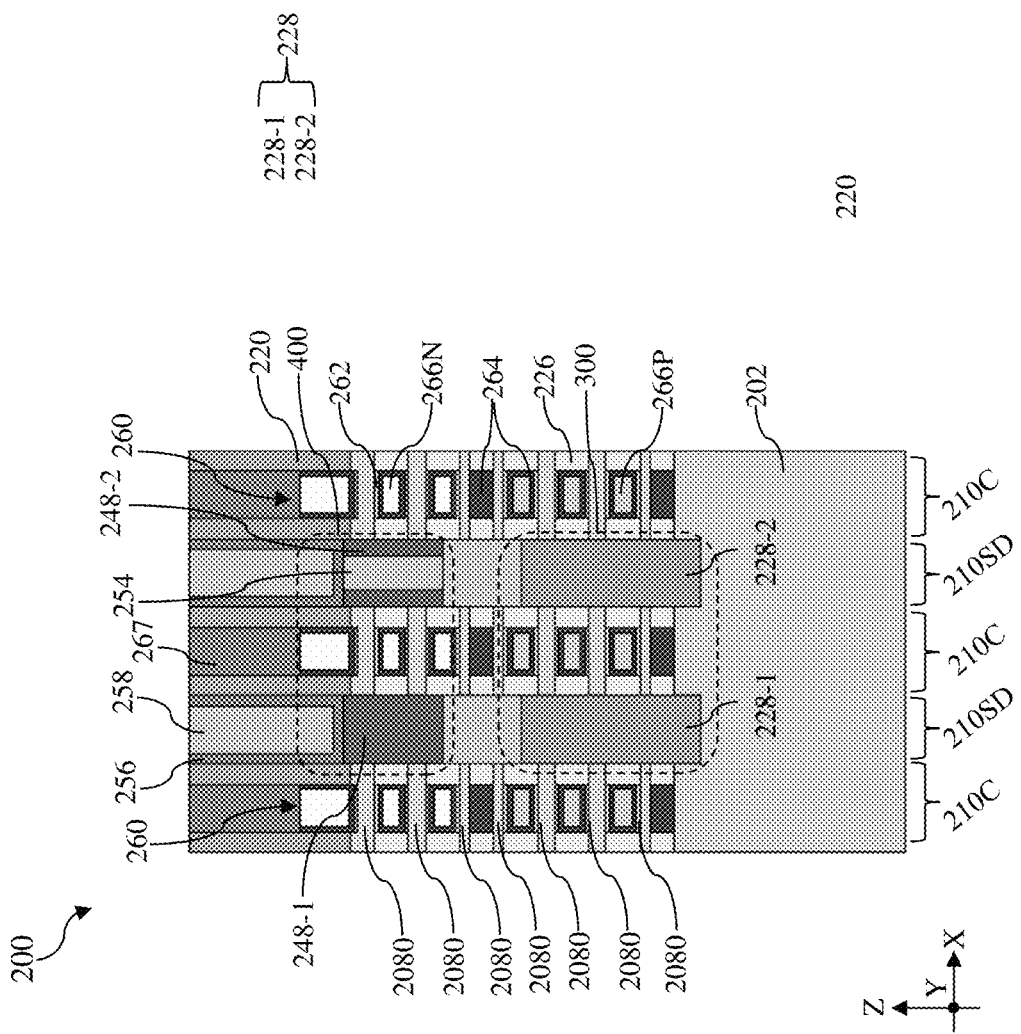

Referring to FIGS. 1 and 14, method 100 includes a block 124 where the dummy gate stack 214 is replaced with a gate structure 260. Operations at block 124 may include removal of the dummy gate stacks 214, release of the channel layers 208 as channel members 2080, formation of gate structures 260 to wrap around the channel members 2080, and formation of a self-aligned capping (SAC) layer 267 over the gate structures 260. The removal of the dummy gate stacks 214 may include one or more etching processes that are selective to the material in the dummy gate stacks 214. For example, the removal of the dummy gate stacks 214 may be performed using as a selective wet etch, a selective dry etch, or a combination thereof. After the removal of the dummy gate stacks 214, sidewalls of the channel layers 208 and sacrificial layers 206 in the channel regions 210C are exposed. Thereafter, the sacrificial layers 206 in the channel regions 210C are selectively removed to release the channel layers 208 as the channel members 2080. Here, because the dimensions of the channel members 2080 are nanoscale, the channel members 2080 may also be referred to as nanostructures. The selective removal of the sacrificial layers 206 may be implemented by selective dry etch, selective wet etch, or other selective etch processes. In some embodiments, the selective wet etching includes an APM etch (e.g., ammonia hydroxide-hydrogen peroxide-water mixture). In some other embodiments, the selective removal includes SiGe oxidation followed by a silicon germanium oxide removal. For example, the oxidation may be provided by ozone clean and then silicon germanium oxide removed by an etchant such as $NH_4OH$.

With the channel members 2080 released, the gate structure 260 is deposited to wrap around each of the channel members 2080, thereby forming a bottom MBC transistor 300 and a top MBC transistor 400 disposed over the bottom MBC transistor 300. In some instances, the gate structure 260 may be a common gate structure to engage channel members 2080 of the bottom MBC transistor 300 and the top MBC transistor 400. In some other instances, the gate structure 260 may include a bottom gate portion to engage channel members 2080 of the bottom MBC transistor 300 and a top gate portion to engage channel members 2080 of the top MBC transistor 400. In those other instances, the bottom gate portion is electrically isolated from the top gate portion. Each of the gate structures 260 includes an interfacial layer 262 to interface the channel members 2080, a gate dielectric layer 264, a p-type electrode layer 266P, and an n-type electrode layer 266N. In some embodiments, the interfacial layer 262 includes silicon oxide and may be formed in a pre-clean process. An example pre-clean process may include use of RCA SC-1 (ammonia, hydrogen peroxide and water) and/or RCA SC-2 (hydrochloric acid, hydrogen peroxide and water). The gate dielectric layer 264 is then deposited over the interfacial layer 262 using ALD, CVD, and/or other suitable methods. The gate dielectric layer 264 is formed of high-K dielectric materials. As used and described herein, high-k dielectric materials include dielectric materials having a high dielectric constant, for example, greater than that of thermal silicon oxide (~3.9). The gate dielectric layer 264 may include hafnium oxide. Alternatively, the gate dielectric layer 264 may include other high-K dielectrics, such as titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), (Ba,Sr)$TiO_3$ (BST), silicon nitride (SiN), silicon oxynitride (SiON), combinations thereof, or other suitable material. In some embodiments illustrated in FIG. 14, small channel-channel spacing resulted from thinner sacrificial layers may result in completely space filling by the gate dielectric layer 264 to selectively disable certain channel members as a measure to isolate the bottom MBC transistor 300 from the top MBC transistor 400.

After the deposition of the gate dielectric layer 264, the p-type electrode layer 266P and the n-type electrode layer 266N are sequentially deposited over the channel regions 210C. The p-type electrode layer 266P and the n-type electrode layer 266N may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the p-type electrode layer 266P may include titanium nitride (TiN), tantalum nitride (TaN), ruthenium (Ru), molybdenum (Mo), aluminum (Al), tungsten nitride (WN), zirconium silicide ($ZrSi_2$), molybdenum silicide ($MoSi_2$), tantalum silicide ($TaSi_2$), nickel silicide ($NiSi_2$), other p-type work function material, or combinations thereof. The n-type electrode layer 266N may include titanium (Ti), aluminum (Al), silver (Ag), manganese (Mn), zirconium (Zr), titanium aluminum (TiAl), titanium aluminum carbide (TiAlC), tantalum carbide (TaC), tantalum carbonitride (TaCN), tantalum silicide nitride (TaSiN), tantalum aluminum (TaAl), tantalum aluminum carbide (TaAlC), titanium aluminum nitride (TiAlN), other n-type work function material, or combinations thereof. To form the n-type electrode layer 266N over the p-type electrode layer 266P, the p-type electrode layer 266P is deposited first and then selectively etched back to expose the channel members 2080 in the top portion 204T. Then the n-type electrode layer 266N is deposited to wrap around each of the channel members in the top portion 204T.

Operations at block 124 may also include forming the self-aligned capping (SAC) layer 267 over the gate structures 260. In some embodiments, the SAC layer 267 may include silicon nitride (SiN), silicon carbide (SiC), silicon carbonitride (SiCN), silicon oxycarbonitride (SiOCN), silicon oxycarbide (SiOC), zirconium nitride (ZrN), aluminum oxynitride (AlON), tantalum carbonitride (TaCN), zirconium silicide (ZrSi), or a metal oxide. Example metal oxides may include lanthanum oxide ($La_2O_3$), aluminum oxide ($Al_2O_3$), zinc oxide (ZnO), zinc aluminum oxide ($Zr_2Al_3O_9$), titanium oxide ($TiO_2$), tantalum oxide ($TaO_2$), zirconium oxide ($ZrO_2$), hafnium oxide ($HfO_2$), yttrium oxide ($Y_2O_3$). The SAC layer 267 protects the gate structures 260 from etching processes that are used for etching frontside source/drain contact openings (such as the first frontside contact opening 268 and the second frontside contact opening 270 to be described below). The SAC layer 267 may be formed by recessing the gate structure, depositing one or more dielectric materials over the recessed gate structure, and performing a CMP process to the one or more dielectric materials.

Figure 15:
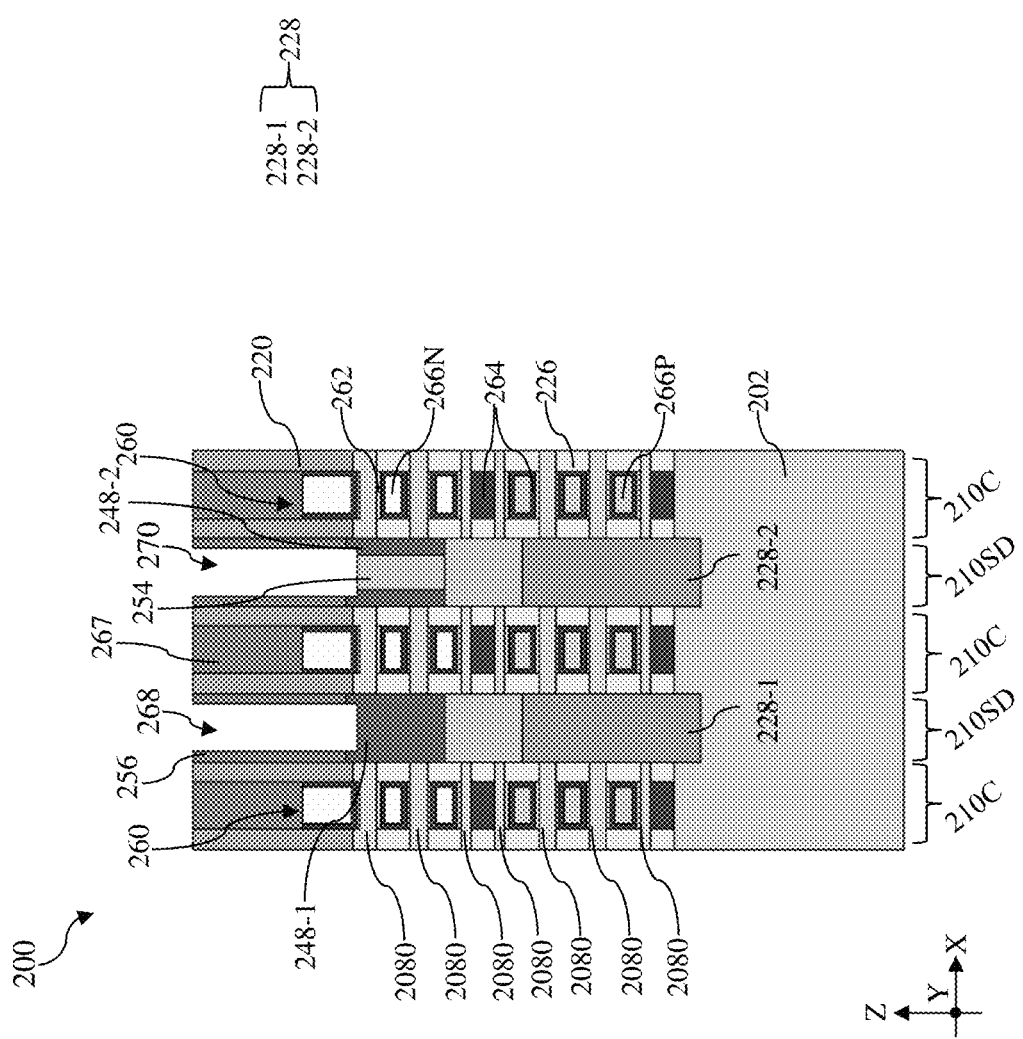
Figure 16:
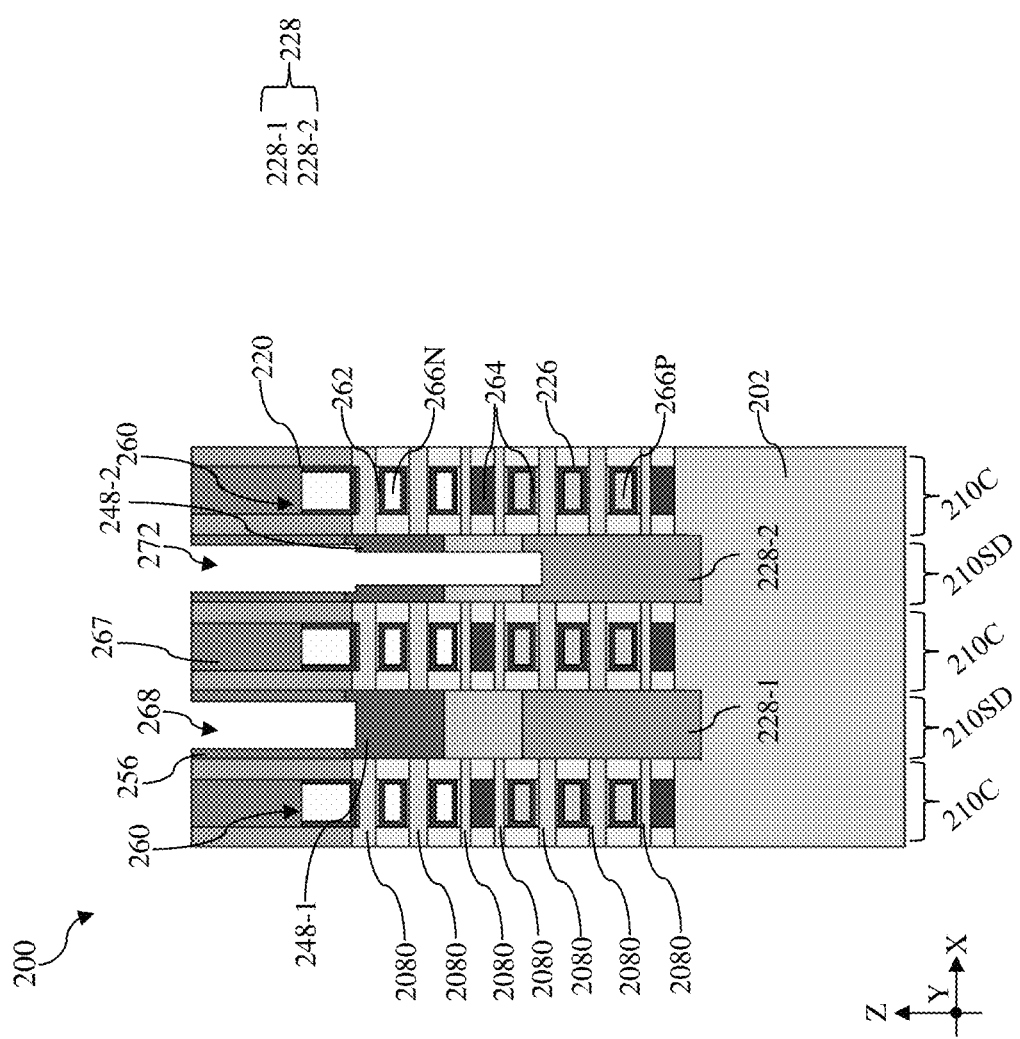

Referring to FIGS. 1, 15 and 16, method 100 includes a block 126 where a first frontside contact opening 268 and a second frontside contact opening 272 are formed. As illustrated in FIGS. 15 and 16, the formation of the first frontside contact opening 268 and the second frontside contact opening 270 may include multiple steps. For example, the ILD layer 258 may be first removed by selective etching. Because the ILD layer 258 includes silicon oxide while the gate spacer layer 220, the CESL 256, and the SAC layer 267 are formed of other dielectric materials, the ILD layer 258 may be selectively etched using a wet etch process or a dry etch process that is selective to silicon oxide. An example wet etch process may include use of diluted hydrofluoric acid (DHF), buffered hydrofluoric acid (BHF, including ammonium fluoride and hydrofluoric acid). An example dry etch process may include use of carbon tetrafluoride ($CF_4$), sulfur hexafluoride ($SF_6$), or nitrogen trifluoride ($NF_3$). Then an anisotropic etch process may be used to breach the CESL 256 to expose the first top source/drain feature 248-1, the second top source/drain feature 248-2, and the filler layer 254. The anisotropic etch process to breach the CESL 256 may be a dry etch process that includes use of carbon tetrafluoride ($CF_4$), sulfur hexafluoride ($SF_6$), nitrogen trifluoride ($NF_3$), or fluoroform ($CHF_3$). At this point, the first frontside contact opening 268 is formed over the first top source/drain feature 248-1, as shown in FIG. 15. Thereafter, the filler layer 254 is selectively etched to expose the separation layer 242 below the second top source/drain feature 248-2. The etch process for the filler layer 254 may be an anisotropic etch process that includes use of oxygen ($O_2$), a fluorine-containing gas (e.g., $CF_4$, $SF_6$, $NF_3$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. It is noted that because the etch process for the filler layer 254 is selective to the filler layer 254, the first top source/drain feature 248-1 and the second top source/drain feature 248-2 may remain substantially unetched or undamaged. Because the composition of the filler layer 254 may be similar to that of the separation layer 242, the dry etch process for the filler layer 254 may extend the opening through the separation layer 242 and into the second bottom source/drain feature 228-2, thereby forming the second frontside contact opening 270. As shown in FIG. 16, the first frontside contact opening 268 exposes the first top source/drain feature 248-1. The second frontside contact opening 270 not only exposes sidewalls of the second top source/drain feature 248-2 but also the top surface of the second bottom source/drain feature 228-2.

Figure 17:
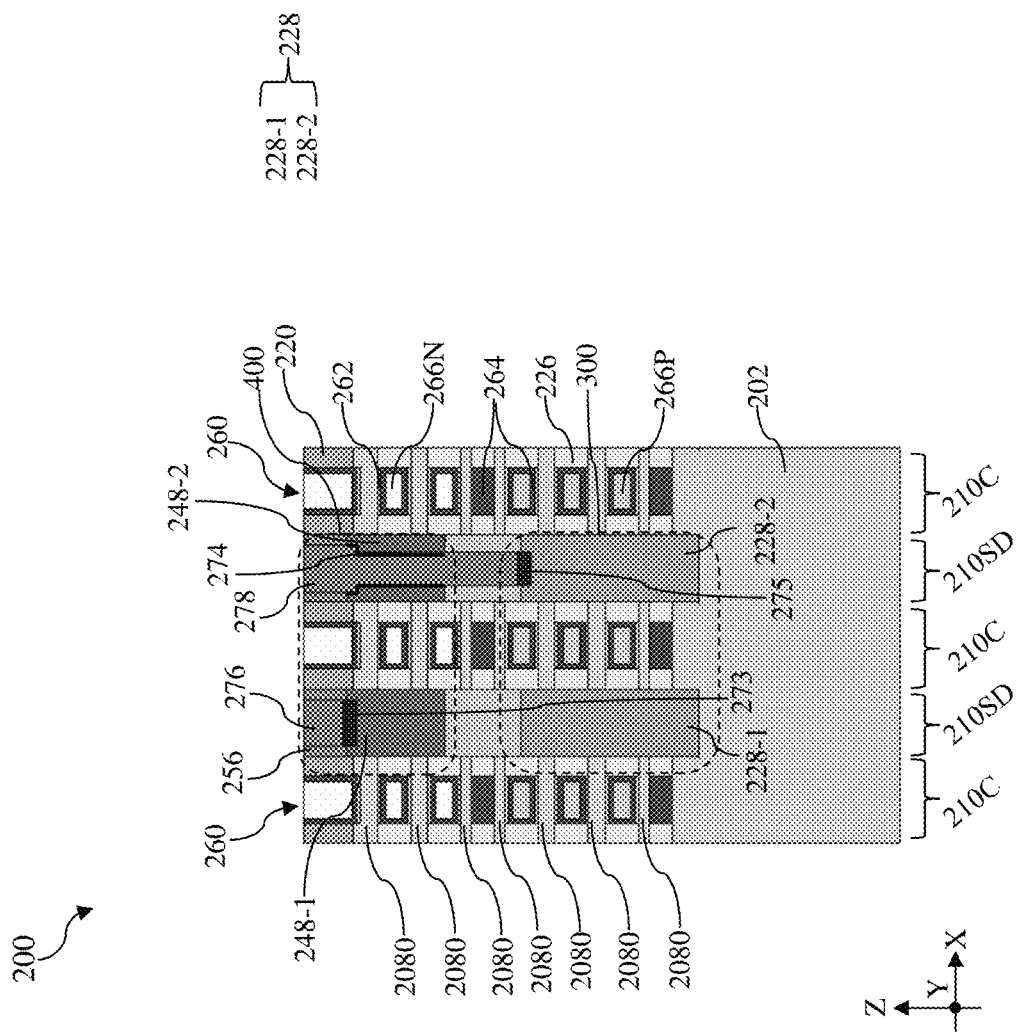

Referring to FIGS. 1 and 17, method 100 includes a block 128 where a first frontside contact 276 is formed in the first frontside contact opening 268 and a second frontside contact 278 is formed in the second frontside contact opening 272. In some embodiments, operations at block 128 may include formation of silicide layers and deposition of a metal fill layer. In an example process, a metal precursor is deposited over the workpiece 200, including over the first frontside contact opening 268 and the second frontside contact opening 270. The metal precursor may include titanium (Ti), tantalum (Ta), nickel (Ni), cobalt (Co), or tungsten (W). Then an anneal process is performed to bring about silicidation between the metal precursor and semiconductor material (such as the first top source/drain feature 248-1, the second bottom source/drain feature 228-2, and the second top source/drain feature 248-2), thereby forming the first silicide layer 273, the second silicide layer 274, and the third silicide layer 275. The silicide layers may include titanium silicide, tantalum silicide, nickel silicide, cobalt silicide, or tungsten silicide. The metal precursor that does not turn into silicide may be removed. After the formation of the silicide layers, the metal fill layer may include tungsten (W), ruthenium (Ru), cobalt (Co), nickel (Ni), or copper (Cu). After the deposition of the metal fill layer, a CMP process may be performed to remove excess materials and define the first frontside contact 276 and the second frontside contact 278. As shown in FIG. 17, the first frontside contact 276 is electrically coupled to the first top source/drain feature 248-1 via the first silicide layer 273; the second frontside contact 278 is electrically coupled to the second top source/drain feature 248-2 via the second silicide layer 274; and the second frontside contact 278 is electrically coupled to the second bottom source/drain feature 228-2 via the third silicide layer 275. It can be seen that the second frontside contact 278 electrically couple the second bottom source/drain feature 228-2 of the bottom MBC transistor 300 and the second top source/drain feature 248-2 of the top MBC transistor 400. In the depicted embodiment, the bottom MBC transistor 300 is p-type and the top MBC transistor 400 is n-type.

Figure 18:
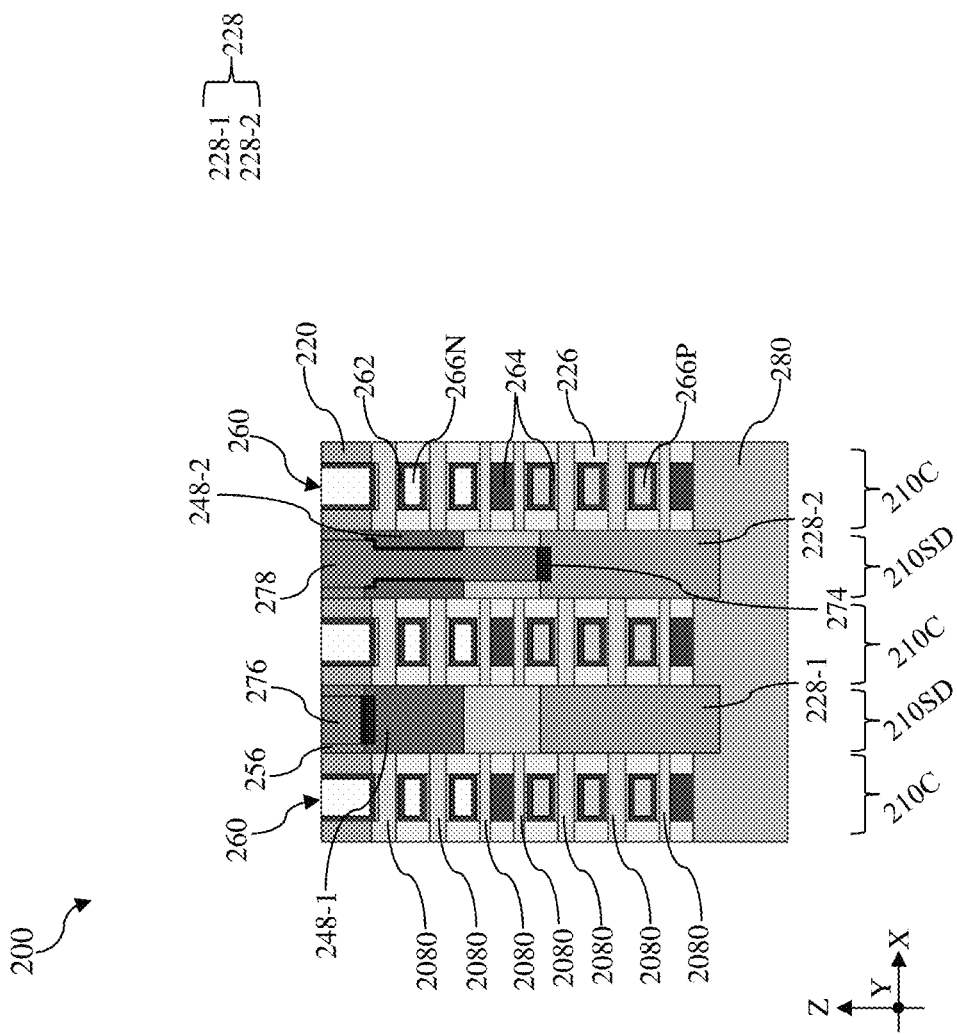
Figure 19:
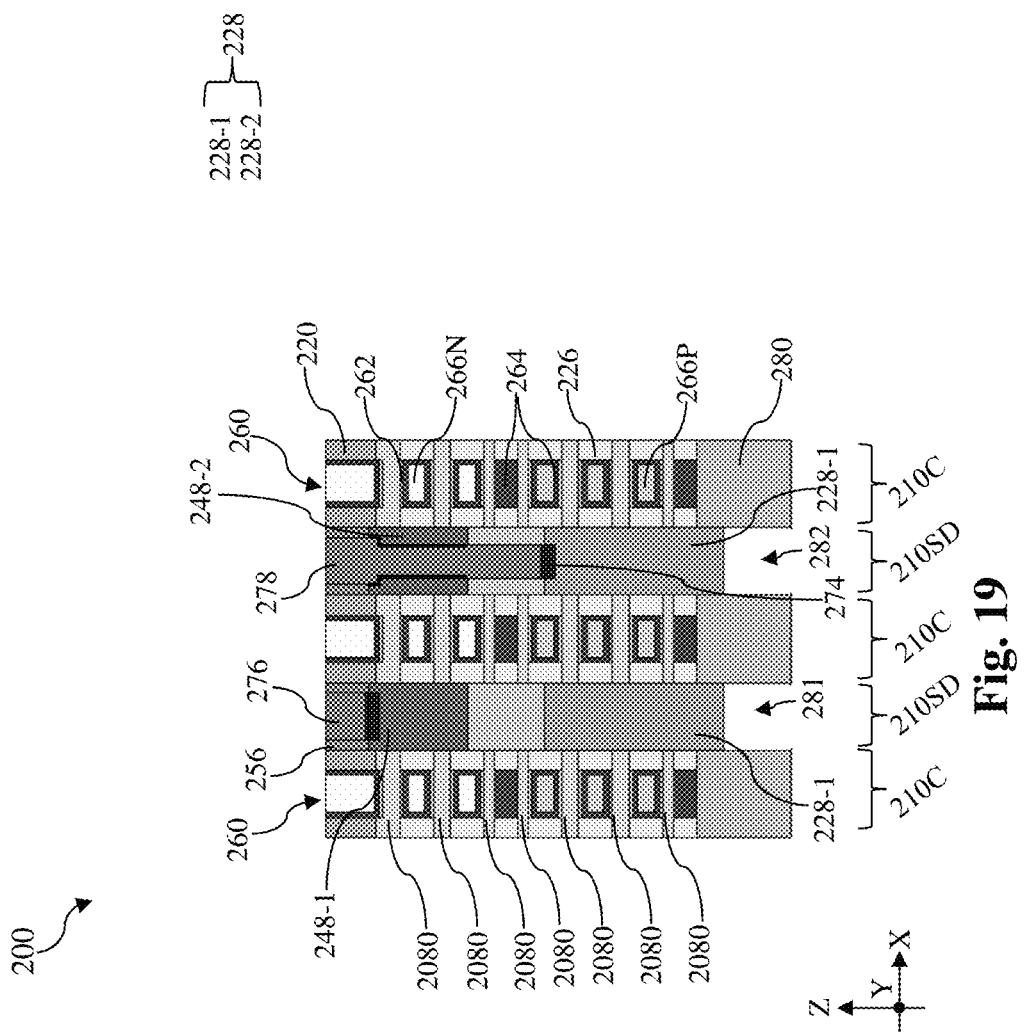
Figure 20:
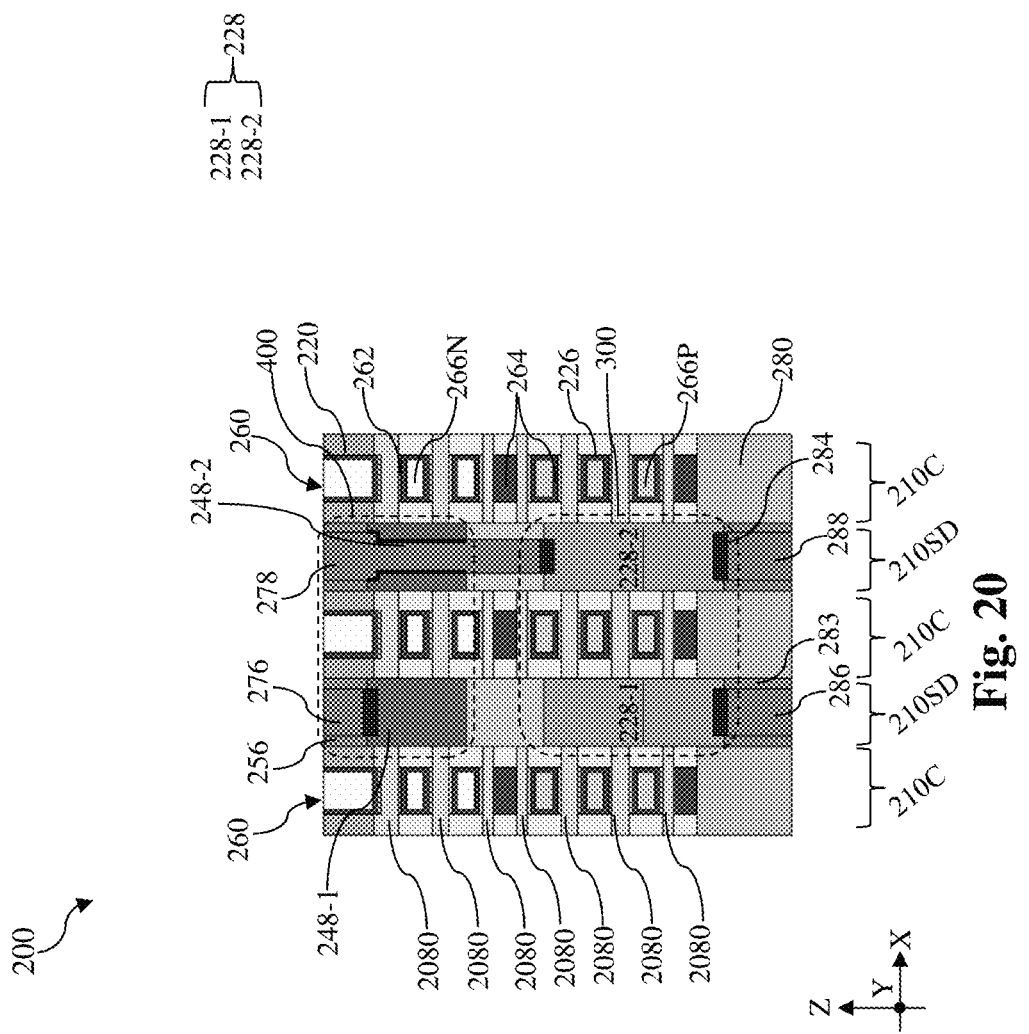

Referring to FIGS. 1, 18, 19, and 20, method 100 includes a block 130 where a first backside contact 286 and a second backside contact 288 are formed. Operations at block 130 may be performed with a back side of the workpiece 200 facing up. In some embodiments, block 130 may include thinning of the substrate, replacement of the substrate 202 with a backside dielectric layer 280 (as shown in FIG. 18), formation of a first backside contact opening 281 and a second backside contact opening 282 (as shown in FIG. 19), and formation of the first backside contact 286 and the second backside contact 288 (as shown in FIG. 20). In an example process, the replacement of the substrate 202 starts off with thinning of the substrate 202. In some instances, the substrate thinning may be performed using grinding or chemical mechanical polishing (CMP). In some embodiments, the substrate 202 is thinned until the isolation feature (not shown) is exposed from the back side of the workpiece 200. After the substrate 202 is thinned, it is selectively removed by a selective etch process. An example selective wet etch process may include use of ammonia (NH 3) or a suitable wet etchant. Because of the selective nature, the removal of the substrate 202 does not substantially etch the first bottom source/drain feature 228-1, the second bottom source/drain feature 228-2, the gate structure 260, and the bottommost inner spacer features 226.

After the removal of the substrate 202, the backside dielectric layer 280 may be deposited over a back side of the workpiece 200 by flowable CVD (FCVD), CVD, plasma-enhanced CVD (PECVD), spin-on coating, or a suitable process, as shown in FIG. 18. Referring to FIG. 19, the first backside contact openings 281 and the second backside contact opening 282 are formed to expose bottom surfaces of the first bottom source/drain feature 228-1 and the second bottom source/drain feature 228-2, respectively. The first backside contact 286 and the second backside contact 288 are then formed in the first backside contact opening 281 and the second backside contact opening 282, respectively. Each of the first backside contact 286 and the second backside contact 288 may include a barrier layer 283 and a backside silicide layer 284. In an example process to form the first backside contact 286 and the second backside contact 288, a metal layer is deposited using PVD or CVD over the first bottom source/drain feature 228-1, the second bottom source/drain feature 228-2, sidewalls of the first backside contact opening 281, and sidewalls of the second backside contact opening 282. The metal layer is then nitridated to form a metal nitride layer. The metal nitride layer is then anisotropically etched to expose the first bottom source/drain feature 228-1 and the second bottom source/drain feature 228-2, thereby forming the barrier layer 283. In some embodiments, the barrier layer 283 may include titanium nitride or tantalum nitride. A metal precursor is then deposited over the barrier layer 283, the first bottom source/drain feature 228-1, and the second bottom source/drain feature 228-2. An anneal process is performed to bring about silicidation between the metal precursor and the first bottom source/drain feature 228-1 or the second bottom source/drain feature 228-2 to form the backside silicide layer 284. Thereafter, a metal fill layer is deposited over the backside silicide layer 284. After a CMP process to remove excess materials, the first backside contact 286 and the second backside contact 288 are formed, as shown in FIG. 20. In some embodiments, the backside silicide layer 284 may include titanium silicide, tantalum silicide, nickel silicide, cobalt silicide, or tungsten silicide. The metal fill layer for the first backside contact 286 and the second backside contact 288 may include tungsten (W), ruthenium (Ru), cobalt (Co), nickel (Ni), or copper (Cu).

Embodiments of the present disclosure provide advantages. The present disclosure provides a local interconnect structure to couple a source/drain feature of a bottom MBC transistor to a source/drain feature of a top MBC transistor stacked over the bottom MBC transistor. While the local interconnect structure of the present disclosure extends through a gap in the source/drain feature on the top, its formation does not include etching through that source/drain feature. According to the embodiments of the present disclosure, the formation of the opening for the local interconnect structure is self-aligned.

In one exemplary aspect, the present disclosure is directed to a semiconductor device. The semiconductor device includes a stack of first channel members, a stack of second channel members disposed directly over the stack of first channel members, a bottom source/drain feature in contact with the stack of the first channel members, a separation layer disposed over the bottom source/drain feature, a top source/drain feature in contact with the stack of second channel members and disposed over the separation layer, and a frontside contact that extends through the top source/drain feature and the separation layer to be electrically coupled to the bottom source/drain feature.

In some embodiments, the frontside contact is spaced apart from the stack of second channel members by the top source/drain feature. In some implementations, the semiconductor device may further include a first silicide feature disposed between the frontside contact and the bottom source/drain feature. In some instances, the semiconductor device may further include a second silicide feature disposed between the frontside contact and the top source/drain feature. In some implementations, the stack of first channel members are disposed over a backside dielectric layer. In some embodiments, the semiconductor device may further include a backside contact disposed in the backside dielectric layer and the backside contact is disposed below and in electrical contact with the bottom source/drain feature. In some implementations, the bottom source/drain feature includes silicon germanium and a p-type dopant and the top source/drain feature includes silicon and an n-type dopant. In some embodiments, the separation layer includes silicon oxide. In some embodiments, the semiconductor device may further include a gate structure wrapping around each of the stack of first channel members and each of the stack of second channel members.

In another exemplary aspect, the present disclosure is directed to a semiconductor structure. The semiconductor structure includes a first bottom source/drain feature and a second bottom source/drain feature, a stack of first channel members extending between the first bottom source/drain feature and the second bottom source/drain feature, a first separation layer over the first bottom source/drain feature, a second separation layer over the second bottom source/drain feature, a first top source/drain feature disposed over the first separation layer, a second top source/drain feature disposed over the second separation layer, a stack of second channel members extending between the first top source/drain feature and the second top source/drain feature, a first frontside contact disposed over and in contact with the first top source/drain feature, and a second frontside contact extending through the second top source/drain feature and the second separation layer to be in contact with the second bottom source/drain feature.

In some embodiments, the stack of first channel members are disposed over a backside dielectric layer. In some implementations, the semiconductor structure may further include a first backside contact below and in contact with the first bottom source/drain feature and a second backside contact below and in contact with the second bottom source/drain feature. The first backside contact and the second backside contact are disposed in the backside dielectric layer. In some implementations, the second frontside contact is spaced apart from the stack of second channel members by the second top source/drain feature. In some instances, the second bottom source/drain feature includes silicon germanium and a p-type dopant and the second top source/drain feature includes silicon and an n-type dopant. In some instances, the first separation layer and the second separation layer include silicon oxide.

In yet another exemplary aspect, the present disclosure is directed to a method. The method includes receiving a workpiece including a substrate and a stack over the substrate, the stack including a plurality of channel layers interleaved by a plurality of sacrificial layers, the plurality of channel layers including a plurality of bottom channel layer and a plurality of top channel layers disposed over the plurality of bottom channel layer, patterning the stack and a portion of the substrate into a fin-shaped structure, the fin-shaped structure including a source/drain region, recessing the source/drain region to form a source/drain trench, exposing sidewalls of the plurality of channel layers, depositing a bottom source/drain feature in the source/drain trench to be in contact with the plurality of bottom channel layers, depositing a separation layer over the bottom source/drain feature, depositing a top source/drain feature over the separation layer to be in contact with the plurality of top channel layers, the top source/drain feature including a gap that exposes the separation layer, forming a filler layer in the gap, forming a contact opening through the filler layer and the separation layer to expose the bottom source/drain feature, and forming a contact feature in the contact opening. In some embodiments, the forming of the filler layer that includes depositing a filler material using atomic layer deposition (ALD) and after the depositing of the filler material, etching back the deposited filler material. In some instances, the filler material includes silicon oxide. In some instances, the bottom source/drain feature includes silicon germanium and a p-type dopant and the top source/drain feature includes silicon and an n-type dopant. In some embodiments, the forming of the contact opening includes use of a selective etch process that etches the filler layer without substantially etching the top source/drain feature.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a first stack of channel members;
a second stack of channel members disposed directly over the first stack of channel members;
a plurality of disabled channel members disposed between the first stack of channel members and the second stack of channel members;
a first gate structure wrapping around each of the first stack of channel members;
a second gate structure wrapping around each of the second stack of channel members;
a first source/drain feature in contact with sidewalls of the first stack of channel members;
a second source/drain features in contact with sidewalls of the second stack of channel members; and
a dielectric separation feature disposed between the first source/drain feature and the second source/drain feature,
wherein the dielectric separation feature is in contact with sidewalls of the plurality of disabled channel members.

2. The semiconductor device of claim 1,
wherein the first gate structure comprises a gate dielectric layer and a p-type electrode layer,
wherein the second gate structure comprises the gate dielectric layer and an n-type electrode layer.

3. The semiconductor device of claim 2, wherein the gate dielectric layer comprises hafnium oxide.

4. The semiconductor device of claim 2,
wherein the p-type electrode layer comprises titanium nitride (TiN), tantalum nitride (TaN), ruthenium (Ru), molybdenum (Mo), aluminum (Al), tungsten nitride (WN), zirconium silicide (ZrSi2), molybdenum silicide (MoSi2), tantalum silicide (TaSi2), or nickel silicide (NiSi2),
wherein the n-type electrode layer comprises titanium (Ti), aluminum (Al), silver (Ag), manganese (Mn), zirconium (Zr), titanium aluminum (TiAl), titanium aluminum carbide (TiAlC), tantalum carbide (TaC), tantalum carbonitride (TaCN), tantalum silicide nitride (TaSiN), tantalum aluminum (TaAl), tantalum aluminum carbide (TaAlC), or titanium aluminum nitride (TiAlN).

5. The semiconductor device of claim 2, wherein the plurality of disabled channel members comprise two disabled channel members.

6. The semiconductor device of claim 5, further comprising:
a dielectric feature sandwiched between the two disabled channel members,
wherein the dielectric feature prevents the p-type electrode layer and the n-type electrode layer from extending between the two disabled channel members.

7. The semiconductor device of claim 6, wherein a composition of the dielectric feature is the same as a composition of the gate dielectric layer.

8. The semiconductor device of claim 1,
wherein the first stack of channel members comprise a first spacing along a vertical direction,
wherein the plurality of disabled channel members comprise a second spacing along the vertical direction,
wherein the second stack of channel members comprise a third spacing along the vertical direction,
wherein the second spacing is smaller than the first spacing or the third spacing.

9. A semiconductor structure, comprising:
a backside dielectric layer;
a first stack of nanostructures and a third stack of nanostructures disposed over the backside dielectric layer;
a second stack of nanostructures disposed over the first stack of nanostructures;
a fourth stack of nanostructures disposed over the third stack of nanostructures;
a first gate structure wrapping around each of the second stack of nanostructures;
a second gate structure wrapping around each of the fourth stack of nanostructures;
a first source/drain feature in contact with sidewalls of the first stack of nanostructures and the second stack of nanostructures;
a second source/drain feature in contact with sidewalls of the fourth stack of nanostructures; and a dielectric separation feature disposed between the first source/drain feature and the second source/drain feature,
wherein the dielectric separation feature is in contact with sidewalls of the second stack of nanostructures.

10. The semiconductor structure of claim 9,
wherein the first source/drain feature comprises silicon germanium doped with a p-type dopant,
wherein the second source/drain feature comprises silicon doped with an n-type dopant.

11. The semiconductor structure of claim 9,
wherein the first gate structure comprises a gate dielectric layer and a p-type electrode layer,
wherein the second gate structure comprises the gate dielectric layer and an n-type electrode layer.

12. The semiconductor structure of claim 11,
wherein the first stack of nanostructures comprise two first nanostructures,
wherein the third stack of nanostructures comprise two second nanostructures.

13. The semiconductor structure of claim 12, further comprising:
a first dielectric feature sandwiched between the two first nanostructures; and
a second dielectric feature sandwiched between the two second nanostructures.

14. The semiconductor structure of claim 13, wherein the gate dielectric layer, the first dielectric feature and the second dielectric feature comprise hafnium oxide.

15. The semiconductor structure of claim 13,
wherein the p-type electrode layer does not extend between the two first nanostructures,
wherein the n-type electrode layer does not extend between the two second nanostructures.

16. The semiconductor structure of claim 9, wherein the dielectric separation feature comprises silicon oxide, tetraethylorthosilicate (TEOS) oxide, un-doped silicate glass, or doped silicon oxide such as borophosphosilicate glass (BPSG), fused silica glass (FSG), phosphosilicate glass (PSG), or boron doped silicon glass (BSG).

17. A method, comprising:
receiving a workpiece that includes a semiconductor substrate and a stack over the semiconductor substrate, the stack comprising:
a bottom silicon germanium layer over the semiconductor substrate,
a bottom silicon layer over the bottom silicon germanium layer,
a first plurality of silicon layers interleaved by a first plurality of silicon germanium layers, the first plurality of silicon layers being over the bottom silicon layer,
a first middle silicon layer over the first plurality of silicon layers,
a middle silicon germanium layer over the first middle silicon layer,
a second middle silicon layer over the middle silicon germanium layer, and
a second plurality of silicon layers interleaved by a second plurality of silicon germanium layers, the second plurality of silicon layers being over the second middle silicon layer;
patterning the stack and a portion of the semiconductor substrate into a fin-shaped structure, the fin-shaped structure comprising a source/drain region and a channel region;
recessing the source/drain region to form a source/drain trench, exposing sidewalls of the stack;
depositing a bottom source/drain feature in the source/drain trench to be in contact with sidewalls of the bottom silicon layer and the first plurality of silicon layers;
depositing a separation layer over the bottom source/drain feature and in contact with sidewalls of the first middle silicon layer and the second middle silicon layer;
depositing a top source/drain feature over the separation layer to be in contact with sidewall the second plurality of silicon layers;
selectively removing the a bottom silicon germanium layer, the first plurality of silicon germanium layers, the middle silicon germanium layer, and the second plurality of silicon germanium layers in the channel region; and
after the selectively removing, depositing a gate dielectric layer to wrap around each of the first plurality of silicon layers and each of the second plurality of silicon layers and to completely fill a space between the bottom silicon layer and the semiconductor substrate and a space between the first middle silicon layer and the second middle silicon layer.

18. The method of claim 17, wherein a thickness of the bottom silicon germanium layer is smaller than a thickness of each of the first plurality of silicon germanium layers.

19. The method of claim 17, wherein a thickness of the middle silicon germanium layer is smaller than a thickness of each of the second plurality of silicon germanium layers.

20. The method of claim 17, further comprising:
depositing a p-type electrode layer to wrap around each of the first plurality of silicon layers in the channel region; and
depositing an n-type electrode layer to wrap around each of the second plurality of silicon layers in the channel region.

* * * * *